United States Patent
Nishimura et al.

(10) Patent No.: US 9,434,856 B2
(45) Date of Patent: Sep. 6, 2016

(54) FILM-FORMING COMPOSITION AND EMBEDDING MATERIAL

(71) Applicant: NISSAN CHEMICAL INDUSTRIES, LTD., Tokyo (JP)

(72) Inventors: Naoya Nishimura, Funabashi (JP); Takahiro Kaseyama, Funabashi (JP); Masaaki Ozawa, Funabashi (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 14/400,258

(22) PCT Filed: May 10, 2013

(86) PCT No.: PCT/JP2013/063147
§ 371 (c)(1),
(2) Date: Nov. 10, 2014

(87) PCT Pub. No.: WO2013/168787
PCT Pub. Date: Nov. 14, 2013

(65) Prior Publication Data
US 2015/0094420 A1    Apr. 2, 2015

(30) Foreign Application Priority Data

May 11, 2012  (JP) ................. 2012-109138
Jan. 11, 2013  (JP) ................. 2013-003176

(51) Int. Cl.

| C08G 18/08 | (2006.01) |
|---|---|
| C09D 179/04 | (2006.01) |
| C09D 4/00 | (2006.01) |
| H01L 51/52 | (2006.01) |
| C08G 73/02 | (2006.01) |
| C08G 73/06 | (2006.01) |
| C09D 133/14 | (2006.01) |
| H01L 51/00 | (2006.01) |
| H01L 51/50 | (2006.01) |

(52) U.S. Cl.
CPC ........... C09D 179/04 (2013.01); C08G 73/026 (2013.01); C08G 73/0273 (2013.01); C08G 73/0644 (2013.01); C09D 4/00 (2013.01); C09D 133/14 (2013.01); H01L 51/0035 (2013.01); H01L 51/0043 (2013.01); H01L 51/5253 (2013.01); H01L 51/50 (2013.01); H01L 51/5262 (2013.01)

(58) Field of Classification Search
CPC ............ C08G 73/0644; C08G 73/026; C08G 73/0273; H01L 51/5253; H01L 51/5262; C09D 179/00; C08L 39/00
See application file for complete search history.

(56) References Cited

U.S. PATENT DOCUMENTS

| 5,886,130 | A | 3/1999 | Trimmer et al. |
|---|---|---|---|
| 8,618,243 | B2 | 12/2013 | Nishimura et al. |
| 8,710,174 | B2 | 4/2014 | Nishimura et al. |
| 8,760,763 | B2 | 6/2014 | Takeuchi |
| 2004/0096757 | A1* | 5/2004 | Tokuda ................. G02B 5/223 430/8 |
| 2012/0049308 | A1* | 3/2012 | Nishimura ......... C08G 73/0273 257/432 |
| 2012/0070656 | A1* | 3/2012 | Chung .................. C09D 5/006 428/338 |

FOREIGN PATENT DOCUMENTS

| EP | 2 636 704 A1 | 9/2013 |
|---|---|---|
| JP | 2000-53659 A | 2/2000 |
| JP | 2001-503077 A | 3/2001 |
| JP | 2004-156001 A | 6/2004 |
| JP | 2007-246877 A | 9/2007 |
| JP | 2008-24832 A | 2/2008 |
| WO | WO 98/11150 A1 | 3/1998 |
| WO | WO 2010/128661 A1 | 11/2010 |
| WO | WO 2012/029617 A1 | 3/2012 |
| WO | WO 2012/060286 A1 | 5/2012 |

OTHER PUBLICATIONS

English translation of International Preliminary Report on Patentability and Written Opinion issued Nov. 11, 2014, in PCT International Application No. PCT/JP2013/063147.

International Search Report issued Aug. 13, 2013, in PCT International Application No. PCT/JP2013/063147.

* cited by examiner

*Primary Examiner* — Shane Fang

(74) *Attorney, Agent, or Firm* — Birch, Stewart, Kolasch & Birch, LLP

(57) ABSTRACT

Provided is a film-forming composition containing organic monomers represented by formula (A) that are capable of providing triazine ring-containing polymers, crosslinking agents, and linear polymers, which contain a repeating unit structure represented by formula (1). Thus, a film-forming composition that is suitable as an embedding material can be provided, said film-forming composition: including triazine ring-containing polymers that are capable of achieving, by polymer alone, high heat resistance, high transparency, a high refractive index, high solubility and low volume shrinkage; and is capable of minimizing occurrences of cracks when embedding films are manufactured. Furthermore, a solvent-free film-forming composition that does not contain any solvents conducive to organic electroluminescent film degradation, can be cured at a low temperature, and is suitable for forming top-emission type organic electroluminescent elements, can be provided.

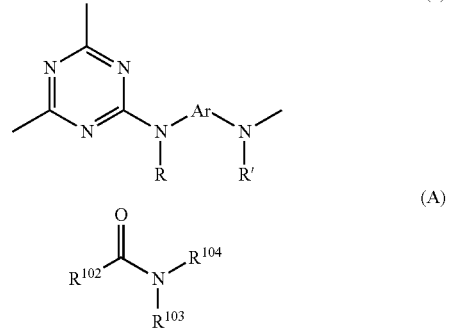

14 Claims, 4 Drawing Sheets

FILM-FORMING COMPOSITION AND EMBEDDING MATERIAL

TECHNICAL FIELD

The present invention relates to a film-forming composition. More specifically, the invention relates to a film-forming composition which is suitable as a film-forming material or an embedding film-forming material applicable to, for example, a light-extracting layer in an organic electroluminescence (EL) device.

BACKGROUND ART

Various efforts have hitherto been made to increase the functionality of polymeric compounds. For example, in one approach currently used to increase the refractive index of polymeric compounds, aromatic rings, halogen atoms or sulfur atoms are introduced onto the compounds. Of such compounds, episulfide polymeric compounds and thiourethane polymeric compounds, both of which have sulfur atoms introduced thereon, are in practical use today as high-refractive index lenses for eyeglasses.

The most effective way to achieve even higher refractive indices in polymeric compounds is known to involve the use of metal oxides. For example, a method for increasing the refractive index by using a hybrid material composed of a siloxane polymer mixed with a material containing small dispersed particles of zirconia, titania or the like has been disclosed (Patent Document 1).

A method in which a condensed ring skeleton having a high refractive index is introduced onto portions of a siloxane polymer has also been disclosed (Patent Document 2).

Numerous attempts have been made to impart heat resistance to polymeric compounds. Specifically, it is well known that the heat resistance of polymeric compounds can be improved by introducing aromatic rings. For example, polyarylene copolymers with substituted arylene recurring units on the backbone have been disclosed (Patent Document 3). Such polymeric compounds show promise primarily in use as heat-resistant plastics.

Melamine resins are familiar as triazine resins, but have very low decomposition temperatures compared with heat-resistant materials such as graphite.

The heat-resistant organic materials composed of carbon and nitrogen that have been in use up until now are for the most part aromatic polyimides and aromatic polyamides. However, because these materials have linear structures, their heat-resistance temperatures are not all that high.

Triazine-based condensation materials have also been reported as nitrogen-containing polymeric materials having heat resistance (Patent Document 4).

In recent years, there has arisen a need for high-performance polymeric materials in the development of electronic devices such as liquid-crystal displays, organic EL displays, optical semiconductor devices (LEDs), solid-state image sensors, organic thin-film solar cells, dye-sensitized solar cells and organic thin-film transistors.

The specific properties desired in such polymeric materials include (1) heat resistance, (2) transparency, (3) high refractive index, (4) high solubility, and (5) low volume shrinkage.

The inventors earlier discovered that hyperbranched polymers containing recurring units with a triazine ring and an aromatic ring have a high refractive index, are capable of achieving, with the polymer alone, high heat resistance, high transparency, high refractive index, high solubility and low volume shrinkage, and are thus suitable as film-forming compositions in the manufacture of electronic devices, and that such compositions can be utilized as embedding materials on organic EL devices and photodiodes (Patent Document 5). However, cracks tend to arise in embedding layers produced from such compositions, and so there has been a desire for a solution to this problem.

Top emission-type organic EL devices which extract light from the opposite side of the substrate (top electrode side) generally have a structure in which are formed, in order, a substrate/a metal electrode/an organic EL layer/a transparent electrode/a sealing layer such as glass. To further increase the light-extracting efficiency, a high refractive index layer is sometimes formed as a light-extracting layer between the transparent electrode and the sealing layer.

However, because the light-extracting layer-forming compositions that have hitherto been used contain solvents, when the light-extracting layer is formed, the organic EL layer degrades under the influence of the solvent.

PRIOR ART DOCUMENTS

Patent Documents

Patent Document 1: JP-A 2007-246877
Patent Document 2: JP-A 2008-24832
Patent Document 3: U.S. Pat. No. 5,886,130
Patent Document 4: JP-A 2000-53659
Patent Document 5: WO 2010/128661

SUMMARY OF THE INVENTION

Problems to be Solved by the Invention

It is therefore an object of the present invention to provide a film-forming composition suitable as an embedding material, which composition includes a triazine ring-containing polymer that is capable of achieving, with the polymer alone, high heat resistance, high transparency, high refractive index, high solubility and low volume shrinkage, and which can minimize crack formation in embedding films produced therefrom. A further object is to provide a film-forming composition which does not contain any solvents that may lead to organic EL film degradation, is low temperature-curable, and is suitable for forming top emission-type organic EL devices.

Means for Solving the Problems

As a result of extensive investigations, the inventors have discovered that film-forming compositions which include a triazine ring-containing polymer, a crosslinking agent and a specific monomer that has a polymerizable carbon-carbon unsaturated double bond and is capable of providing a linear polymer form embedding films which are not prone to cracking and are thus suitable as embedding materials. The inventors have also discovered that solvent-free film-forming compositions which include a triazine ring-containing polymer, a crosslinking agent and the foregoing monomer, and contain no solvents, are capable of resolving the problem of organic EL film degradation.

Accordingly, the invention provides the following film-forming compositions and embedding materials.
1. A film-forming composition including:
    a triazine ring-containing polymer which includes a recurring unit structure of formula (1) below:

[Chemical Formula 1]

(1)

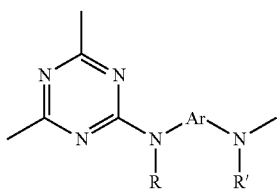

wherein R and R' are each independently a hydrogen atom, an alkyl group, an alkoxy group, an aryl group or an aralkyl group; and Ar is at least one moiety selected from the group consisting of moieties of formulas (2) to (13) below:

[Chemical Formula 2]

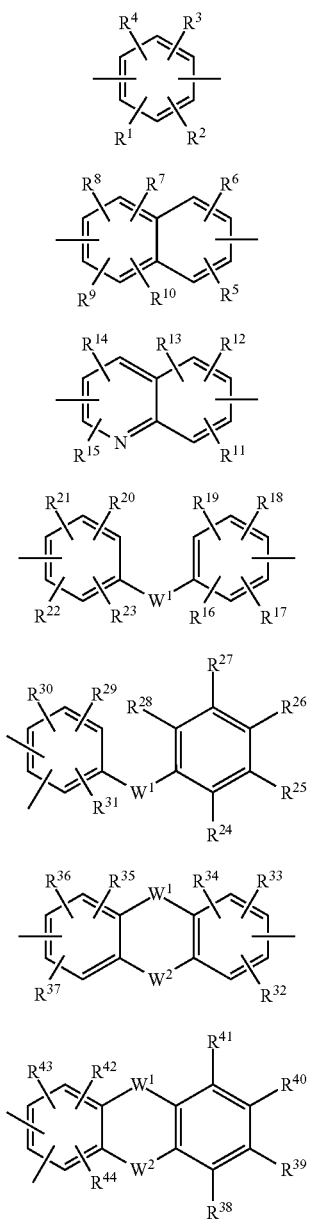

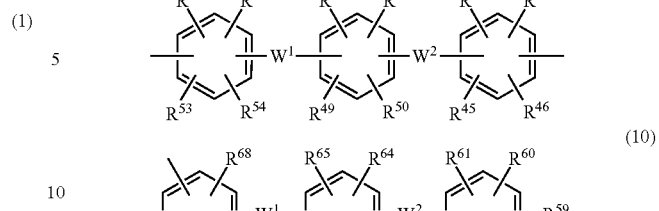

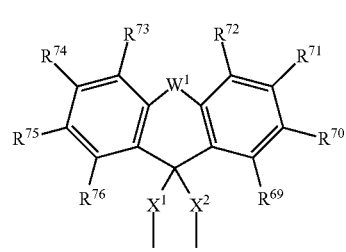

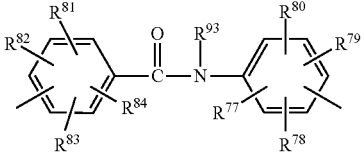

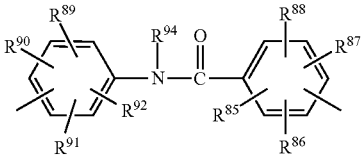

wherein $R^1$ to $R^{92}$ are each independently a hydrogen atom, a halogen atom, a carboxyl group, a sulfone group, an alkyl group of 1 to 10 carbons, or an alkoxy group of 1 to 10 carbons; $R^{93}$ and $R^{94}$ are hydrogen atoms or alkyl groups of 1 to 10 carbons; $W^1$ and $W^2$ are each independently a single bond, $CR^{95}R^{96}$ (wherein $R^{95}$ and $R^{96}$ are each independently a hydrogen atom or an alkyl group of 1 to 10 carbons, with the proviso that $R^{95}$ and $R^{96}$ may together form a ring), $C=O$, O, S, SO, $SO_2$ or $NR^{97}$ (wherein $R^{97}$ is a hydrogen atom or an alkyl group of 1 to 10 carbons); and $X^1$ and $X^2$ are each independently a single bond, an alkylene group of 1 to 10 carbons, or a group of formula (14) below:

[Chemical Formula 3]

(14)

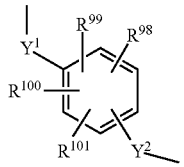

wherein $R^{98}$ to $R^{101}$ are each independently a hydrogen atom, a halogen atom, a carboxyl group, a sulfone group, an alkyl group of 1 to 10 carbons, or an alkoxy group of 1 to 10 carbons; and $Y^1$ and $Y^2$ being each independently a single bond or an alkylene group of 1 to 10 carbons;

a crosslinking agent; and
an organic monomer capable of providing a linear polymer, wherein
the organic monomer is a compound of formula (A) below:

[Chemical Formula 4]

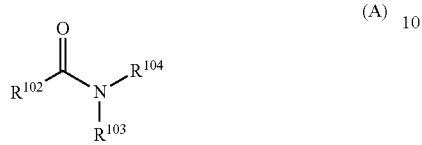

(A)

wherein $R^{102}$ and $R^{104}$ are each independently a hydrogen atom, an alkyl group of 1 to 10 carbons or a polymerizable carbon-carbon double bond-containing group; and $R^{103}$ being a hydrogen atom or an alkyl group of 1 to 10 carbons, with the proviso that either of $R^{102}$ and $R^{104}$ is a polymerizable carbon-carbon double bond-containing group but $R^{102}$ and $R^{104}$ are not both at the same time polymerizable carbon-carbon double bond-containing groups.

2. The film-forming composition of 1 above, wherein $R^{102}$ and $R^{103}$ in formula (A) are both hydrogen atoms and $R^{104}$ is a polymerizable carbon-carbon double bond-containing group.

3. The film-forming composition of 1 or 2 above, wherein the organic monomer is N-vinylformamide.

4. The film-forming composition of 1, 2 or 3 above, further including a solvent.

5. The film-forming composition of 1, 2 or 3 above which is solvent-free.

6. The film-forming composition of any one of 1 to 4 above, wherein the crosslinking agent is a polyfunctional epoxy compound and/or a polyfunctional (meth)acrylic compound.

7. The film-forming composition of 6 above, wherein the crosslinking agent is a polyfunctional (meth)acrylic compound.

8. The film-forming composition of 6 or 7 above, wherein the polyfunctional (meth)acrylic compound is a compound which at 25° C. is liquid and has a viscosity of 5,000 mPa·s or less.

9. The film-forming composition of 1, 2, 3 or 5 above, wherein the crosslinking agent is a polyfunctional epoxy compound, a polyfunctional vinyl ether compound or a polyfunctional allyl ether compound.

10. The film-forming composition of 9 above, wherein the crosslinking agent is a polyfunctional allyl ether compound.

11. An embedding material composed of the film-forming composition of any one of 1 to 4 and 6 to 8 above.

12. An embedding film obtained from the embedding material of 11 above.

13. An electronic device which includes the embedding film of 12 above.

14. A cured film obtained by curing the film-forming composition of any one of 1 to 10 above.

15. An electronic device which includes the cured film of 14 above.

16. A top emission-type organic electroluminescence device which includes a cured film obtained by curing the film-forming composition according to any one of 1 to 3, 5, 9 and 10 above.

Advantageous Effects of the Invention

The film-forming composition of the invention includes a specific triazine ring-containing polymer, a crosslinking agent and a specific organic monomer capable of providing a linear polymer. By using this composition, a cured film which has a relatively uniform film thickness and is not prone to crack formation can be produced. Moreover, in cases where the film-forming composition of the invention contains no solvent (referred to below as a "solvent-free film-forming composition"), it is possible to form a cured film on an organic film such as an organic EL film without degrading the organic film.

The cured film obtained from the inventive composition can be advantageously used as a component in the fabrication of electronic devices such as liquid-crystal displays, organic EL displays, LEDs, solid-state image sensors, organic thin-film solar cells, dye-sensitized solar cells and organic thin-film transistors.

In particular, because the cured film of the invention is a film that is not prone to crack formation, it can be advantageously used as an embedding material applicable to the light-extracting layers of organic EL devices. In addition, because solvent-free film-forming compositions do not degrade organic films such as organic EL films, cured films obtained from such compositions can be advantageously used as light-extracting layers in top emission-type organic EL devices.

Also, such cured films can be advantageously used as the following solid-state image sensor components: embedding films and planarizing films on photodiodes, planarizing films before and after color filters, microlenses, and planarizing films and conformal films on microlenses.

BRIEF DESCRIPTION OF THE DIAGRAMS

EMBODIMENT FOR CARRYING OUT THE INVENTION

Figure 1:
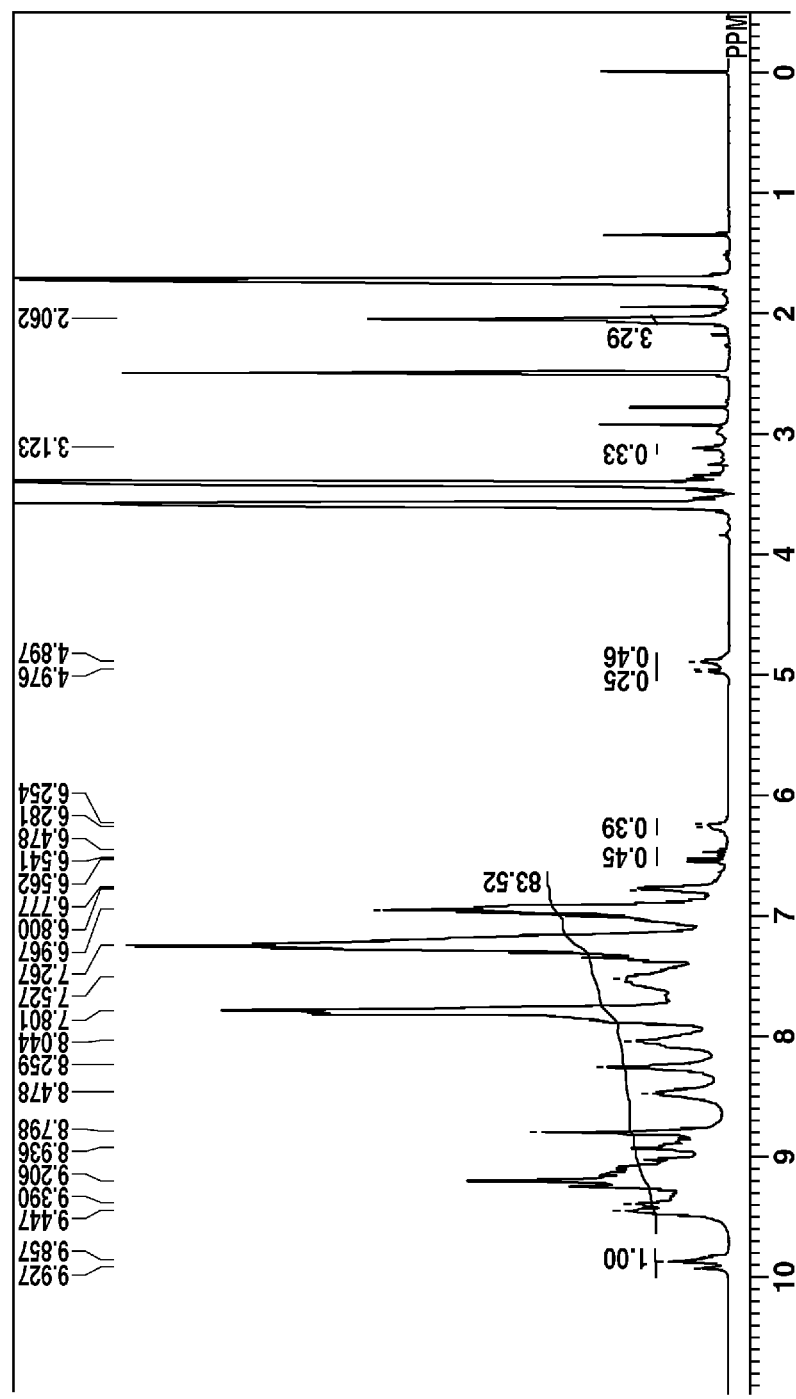
FIG. 1 is an $^1$H-NMR spectrum of the polymeric compound [3] obtained in Synthesis Example 1.

The film-forming composition of the invention includes a triazine ring-containing polymer, a crosslinking agent, and an organic monomer capable of providing a linear polymer.

[Triazine Ring-Containing Polymer]

The triazine ring-containing polymer includes a recurring unit structure of formula (1) below.

[Chemical Formula 5]

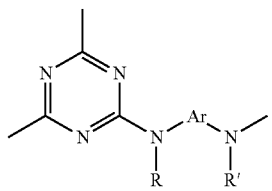

(1)

In formula (1), R and R' are each independently a hydrogen atom, an alkyl group, an alkoxy group, an aryl group or an aralkyl group.

The number of carbons on the alkyl group, although not particularly limited, is preferably from 1 to 20. To further increase the heat resistance of the polymer, the number of carbons is more preferably from 1 to 10, and even more preferably from 1 to 3. The alkyl group may have a linear, branched or cyclic structure.

Illustrative examples of the alkyl group include methyl, ethyl, n-propyl, isopropyl, cyclopropyl, n-butyl, isobutyl, s-butyl, t-butyl, cyclobutyl, 1-methylcyclopropyl, 2-methylcyclopropyl, n-pentyl, 1-methyl-n-butyl, 2-methyl-n-butyl, 3-methyl-n-butyl, 1,1-dimethyl-n-propyl, 1,2-dimethyl-n-propyl, 2,2-dimethyl-n-propyl, 1-ethyl-n-propyl, cyclopentyl, 1-methylcyclobutyl, 2-methylcyclobutyl, 3-methylcyclobutyl, 1,2-dimethylcyclopropyl, 2,3-dimethylcyclopropyl, 1-ethylcyclopropyl, 2-ethylcyclopropyl, n-hexyl, 1-methyl-n-pentyl, 2-methyl-n-pentyl, 3-methyl-n-pentyl, 4-methyl-n-pentyl, 1,1-dimethyl-n-butyl, 1,2-dimethyl-n-butyl, 1,3-dimethyl-n-butyl, 2,2-dimethyl-n-butyl, 2,3-dimethyl-n-butyl, 3,3-dimethyl-n-butyl, 1-ethyl-n-butyl, 2-ethyl-n-butyl, 1,1,2-trimethyl-n-propyl, 1,2,2-trimethyl-n-propyl, 1-ethyl-1-methyl-n-propyl, 1-ethyl-2-methyl-n-propyl, cyclohexyl, 1-methylcyclopentyl, 2-methylcyclopentyl, 3-methylcyclopentyl, 1-ethylcyclobutyl, 2-ethylcyclobutyl, 3-ethylcyclobutyl, 1,2-dimethylcyclobutyl, 1,3-dimethylcyclobutyl, 2,2-dimethylcyclobutyl, 2,3-dimethylcyclobutyl, 2,4-dimethylcyclobutyl, 3,3-dimethylcyclobutyl, 1-n-propylcyclopropyl, 2-n-propylcyclopropyl, 1-isopropylcyclopropyl, 2-isopropylcyclopropyl, 1,2,2-trimethylcyclopropyl, 1,2,3-trimethylcyclopropyl, 2,2,3-trimethylcyclopropyl, 1-ethyl-2-methylcyclopropyl, 2-ethyl-1-methylcyclopropyl, 2-ethyl-2-methylcyclopropyl and 2-ethyl-3-methylcyclopropyl.

The number of carbons on the alkoxy group, although not particularly limited, is preferably from 1 to 20. To further increase the heat resistance of the polymer, the number of carbons is more preferably from 1 to 10, and even more preferably from 1 to 3. The alkyl moiety thereon may have a linear, branched or cyclic structure.

Illustrative examples of the alkoxy group include methoxy, ethoxy, n-propoxy, isopropoxy, n-butoxy, isobutoxy, s-butoxy, t-butoxy, n-pentyloxy, 1-methyl-n-butoxy, 2-methyl-n-butoxy, 3-methyl-n-butoxy, 1,1-dimethyl-n-propoxy, 1,2-dimethyl-n-propoxy, 2,2-dimethyl-n-propoxy, 1-ethyl-n-propoxy, n-hexyloxy, 1-methyl-n-pentyloxy, 2-methyl-n-pentyloxy, 3-methyl-n-pentyloxy, 4-methyl-n-pentyloxy, 1,1-dimethyl-n-butoxy, 1,2-dimethyl-n-butoxy, 1,3-dimethyl-n-butoxy, 2,2-dimethyl-n-butoxy, 2,3-dimethyl-n-butoxy, 3,3-dimethyl-n-butoxy, 1-ethyl-n-butoxy, 2-ethyl-n-butoxy, 1,1,2-trimethyl-n-propoxy, 1,2,2-trimethyl-n-propoxy, 1-ethyl-1-methyl-n-propoxy and 1-ethyl-2-methyl-n-propoxy.

The number of carbons on the aryl group, although not particularly limited, is preferably from 6 to 40. To further increase the heat resistance of the polymer, the number of carbons is more preferably from 6 to 16, and even more preferably from 6 to 13.

Illustrative examples of the aryl group include phenyl, o-chlorophenyl, m-chlorophenyl, p-chlorophenyl, o-fluorophenyl, p-fluorophenyl, o-methoxyphenyl, p-methoxyphenyl, p-nitrophenyl, p-cyanophenyl, α-naphthyl, β-naphthyl, o-biphenylyl, m-biphenylyl, p-biphenylyl, 1-anthryl, 2-anthryl, 9-anthryl, 1-phenanthryl, 2-phenanthryl, 3-phenanthryl, 4-phenanthryl and 9-phenanthryl.

The number of carbons on the aralkyl group, although not particularly limited, is preferably from 7 to 20. The alkyl moiety thereon may be linear, branched or cyclic. Illustrative examples of the aralkyl group include benzyl, p-methylphenylmethyl, m-methylphenylmethyl, o-ethylphenylmethyl, m-ethylphenylmethyl, p-ethylphenylmethyl, 2-propylphenylmethyl, 4-isopropylphenylmethyl, 4-isobutylphenylmethyl and α-naphthylmethyl.

In above formula (1), Ar is at least one moiety selected from among those of formulas (2) to (13) below.

[Chemical Formula 6]

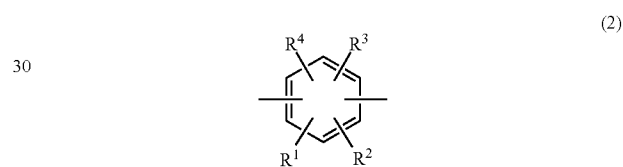

(2)

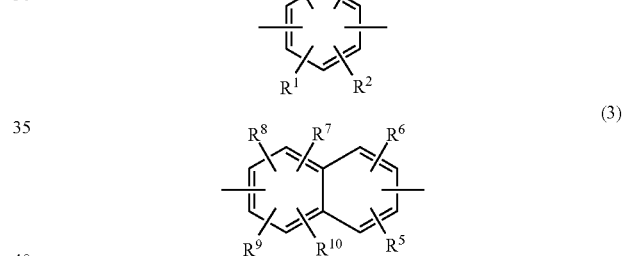

(3)

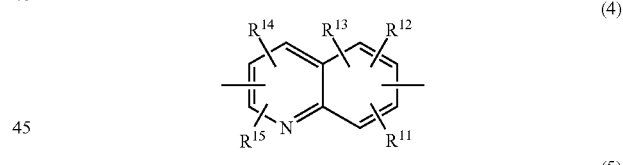

(4)

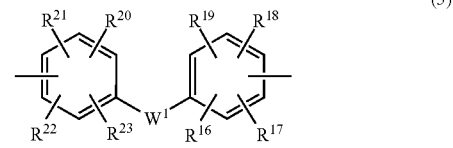

(5)

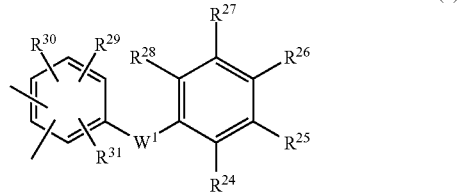

(6)

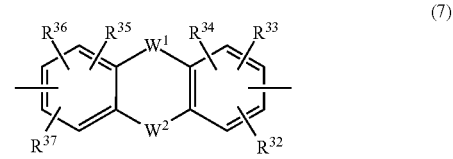

(7)

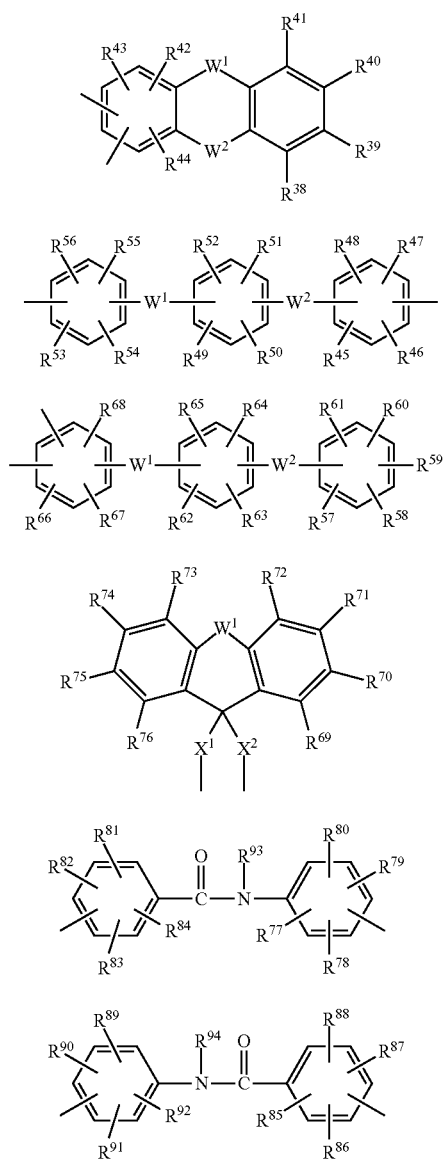

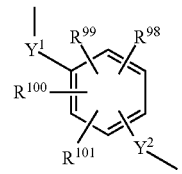

In the above formula, $R^{98}$ to $R^{101}$ are each independently a hydrogen atom, a halogen atom, a carboxyl group, a sulfone group, an alkyl group of 1 to 10 carbons, or an alkoxy group of 1 to 10 carbons. $Y^1$ and $Y^2$ are each independently a single bond or an alkylene group of 1 to 10 carbons. These halogen atoms, alkyl groups and alkoxy groups are exemplified by the same groups as mentioned above.

The alkylene group of 1 to 10 carbons is preferably one that is linear or branched. Illustrative examples include methylene, ethylene, propylene, trimethylene, tetramethylene and pentamethylene.

In particular, Ar is preferably at least one group selected from among the groups of formulas (2) and (5) to (13), and more preferably at least one group selected from among the groups of formulas (2), (5), (7), (8) and (11) to (13). Illustrative examples of groups of formulas (2) to (13) include, but are not limited to, those having the following formulas.

[Chemical Formula 8]

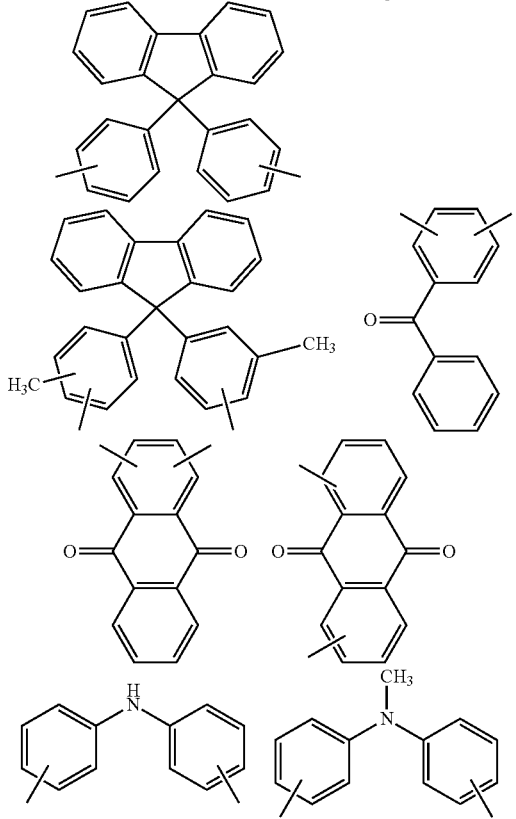

In the above formulas, $R^1$ to $R^{92}$ are each independently a hydrogen atom, a halogen atom, a carboxyl group, a sulfone group, an alkyl group of 1 to 10 carbons, or an alkoxy group of 1 to 10 carbons. $R^{93}$ and $R^{94}$ are hydrogen atoms or alkyl groups of 1 to 10 carbons. $W^1$ and $W^2$ are each independently a single bond, $CR^{95}R^{96}$ (wherein $R^{95}$ and $R^{96}$ are each independently a hydrogen atom or an alkyl group of 1 to 10 carbons, with the proviso that $R^{95}$ and $R^{96}$ may together form a ring), C=O, O, S, SO, $SO_2$ or $NR^{97}$ (wherein $R^{97}$ is a hydrogen atom or an alkyl group of 1 to 10 carbons).

Examples of the halogen atom include fluorine, chlorine, bromine and iodine.

These alkyl groups and alkoxy groups are exemplified by the same groups as mentioned above.

$X^1$ and $X^2$ are each independently a single bond, an alkylene group of 1 to 10 carbons, or a group of formula (14) below.

-continued
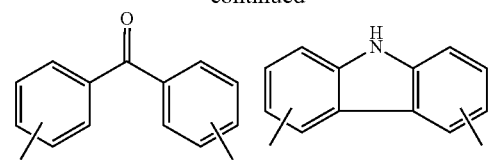
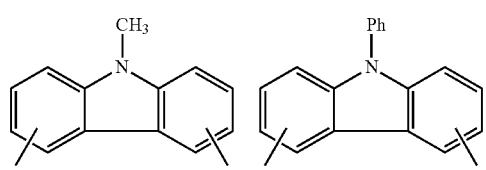
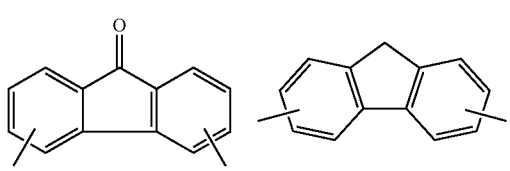
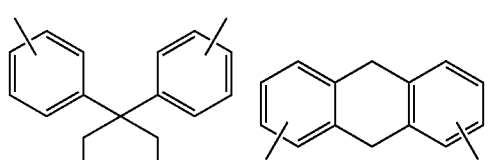
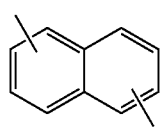
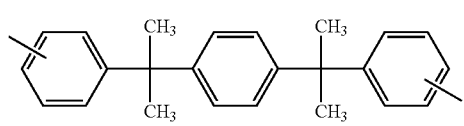
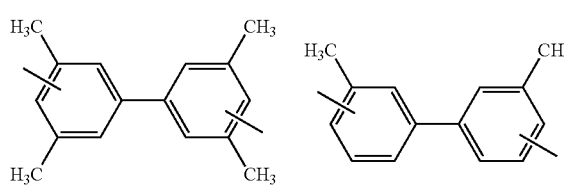
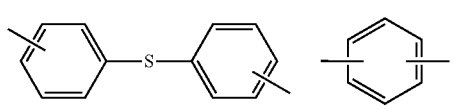
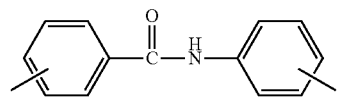
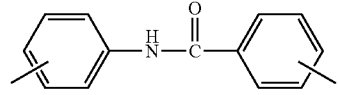
Of these, to obtain a polymer having a higher refractive index, the groups of the following formulas are more preferred.
[Chemical Formula 9]
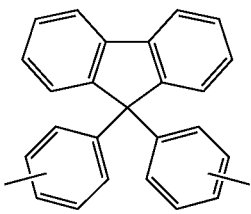
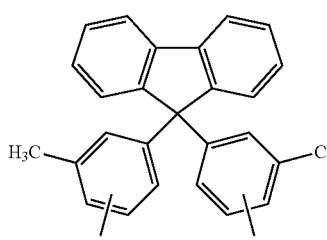
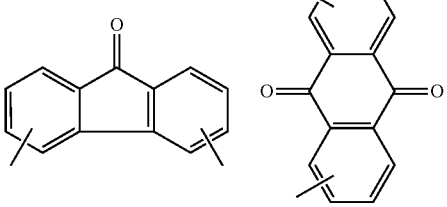
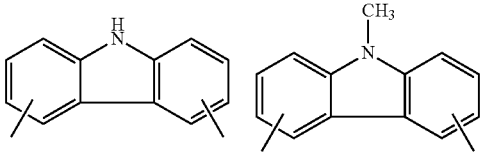
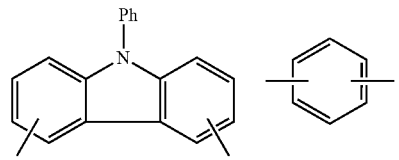
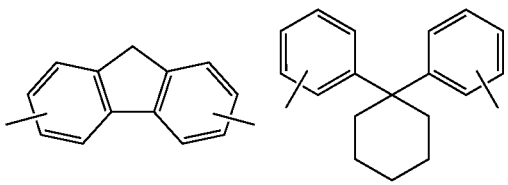
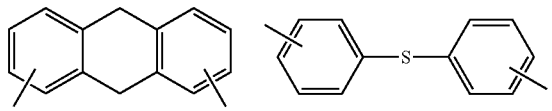
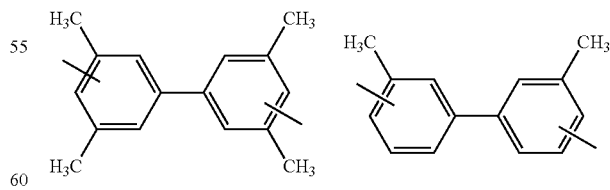
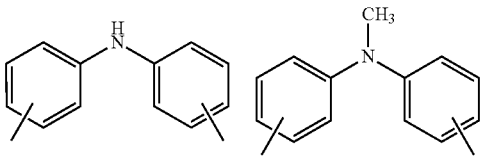

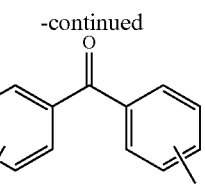

To further increase the solubility in very safe solvents such as resist solvents, it is preferable to include a recurring unit structure of formula (15) below.

[Chemical Formula 10]

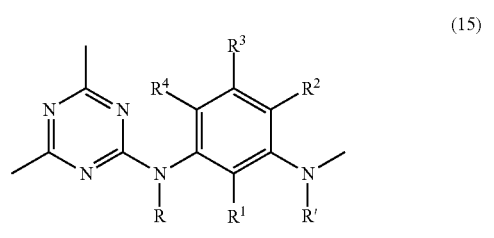

(15)

In this formula, R, R' and $R^1$ to $R^4$ are as defined above.

From such a standpoint, especially preferred recurring unit structures include those of formula (16) below, with hyperbranched polymers of formula (17) below being most preferred.

[Chemical Formula 11]

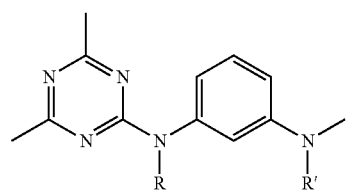

(16)

In this formula, R and R' are as defined above.

[Chemical Formula 12]

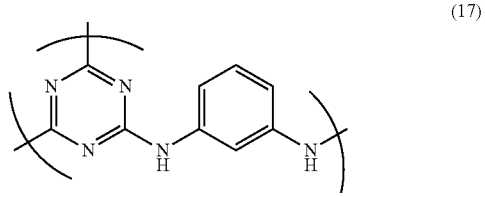

(17)

The triazine ring-containing polymer used in this invention has a weight-average molecular weight which, although not particularly limited, is preferably between 500 and 500,000, and more preferably between 500 and 100,000. To further enhance the heat resistance and lower the shrinkage ratio, the weight-average molecular weight is preferably at least 2,000. To further increase the solubility and lower the viscosity of the resulting solution, the weight-average molecular weight is preferably not more than 50,000, more preferably not more than 30,000, and even more preferably not more than 10,000.

The weight-average molecular weight in the invention is the weight-average molecular weight measured by gel permeation chromatography (GPC) against a polystyrene standard.

The triazine ring-containing polymer of the invention may be prepared by the method disclosed in above-cited Patent Document 5.

For example, as shown in Scheme 1 below, a hyperbranched polymer having the recurring structure (17') can be obtained by reacting a cyanuric halide (18) with an m-phenylenediamine compound (19) in a suitable organic solvent.

Scheme 1

[Chemical Formula 13]

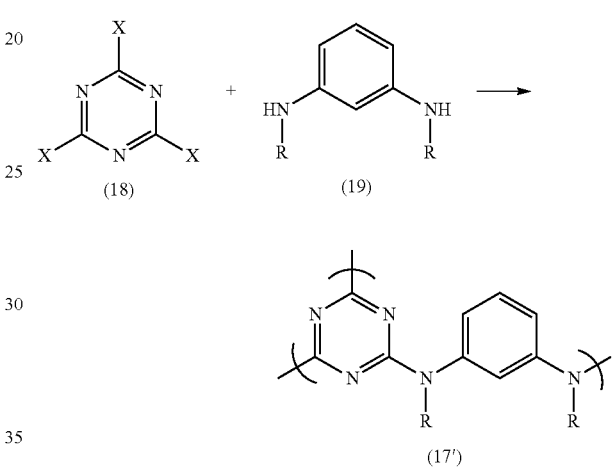

In the above formula, X is independently a halogen atom. R is as defined above.

As shown in Scheme 2 below, a hyperbranched polymer having the recurring structure (17') can be also synthesized from a compound (20) obtained by reacting equimolar amounts of a cyanuric halide (18) and an m-phenylenediamine compound (19) in a suitable organic solvent.

Scheme 2

[Chemical Formula 14]

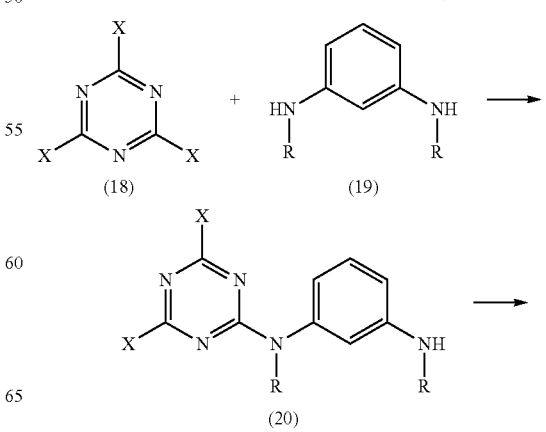

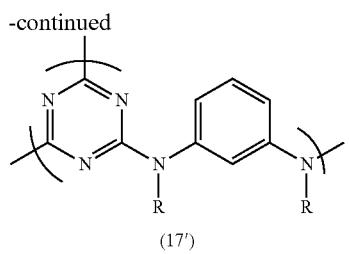

(17')

In the above formula, X is independently a halogen atom. R is as defined above.

In the methods of Schemes 1 and 2, the respective starting materials may be charged in any suitable amounts so long as the target polymer is obtained, although the use of from 0.01 to 10 equivalents of the diamino compound (19) per equivalent of the cyanuric halide (18) is preferred. In the method of Scheme 1 in particular, it is preferable to avoid using 3 equivalents of the diamino compound (19) per 2 equivalents of the cyanuric halide (18). By including the respective functional groups in amounts that are not chemically equivalent, the formation of a gel can be prevented.

To obtain hyperbranched polymers of various molecular weights which have many terminal triazine rings, it is preferable to use the diamino compound (19) in an amount of less than 3 equivalents per 2 equivalents of the cyanuric halide (18). On the other hand, to obtain hyperbranched polymers of various molecular weights which have many terminal amines, it is preferable to use the cyanuric halide (18) in an amount of less than 2 equivalents per 3 equivalents of the diamino compound (19).

For example, in cases where a thin film has been produced, in order for the film to have an excellent transparency and light resistance, a hyperbranched polymer having many terminal triazine rings is preferred.

By suitably regulating the amounts of the diamino compound (19) and the cyanuric halide (18) in this way, the molecular weight of the resulting hyperbranched polymer can be easily regulated.

Various solvents that are commonly used in this type of reaction may be used as the organic solvent. Illustrative examples include tetrahydrofuran, dioxane, dimethylsulfoxide; amide solvents such as N,N-dimethylformamide, N-methyl-2-pryrrolidone, tetramethylurea, hexamethylphosphoramide, N,N-dimethylacetamide, N-methyl-2-piperidone, N,N-dimethylethyleneurea, N,N,N',N'-tetramethylmalonamide, N-methylcaprolactam, N-acetylpyrrolidine, N,N-diethylacetamide, N-ethyl-2-pyrrolidone, N,N-dimethylpropionamide, N,N-dimethylisobutyramide, N-methylformamide and N,N'-dimethylpropyleneurea; and mixed solvents thereof.

Of the above, N,N-dimethylformamide, dimethylsulfoxide, N-methyl-2-pyrrolidone, N,N-dimethylacetamide, and mixed solvents thereof are preferred. N,N-Dimethylacetamide and N-methyl-2-pyrrolidone are especially preferred.

In the Scheme 1 reaction and the second stage reaction in Scheme 2, the reaction temperature may be suitably set in the range from the melting point of the solvent used to the boiling point of the solvent, although the temperature is preferably from about 0° C. to about 150° C., and more preferably from 60° C. to 100° C. In the Scheme 1 reaction in particular, to suppress linearity and increase the degree of branching, the reaction temperature is preferably from 60° C. to 150° C., more preferably from 80° C. to 150° C., and even more preferably from 80° C. to 120° C.

In the first stage reaction of Scheme 2, the reaction temperature may be suitably set in the range from the melting point of the solvent used to the boiling point of the solvent, with a temperature of from about −50° C. to about 50° C. being preferred, a temperature of from about −20° C. to about 50° C. being more preferred, a temperature of from about −10° C. to about 50° C. being even more preferred, and a temperature of from −10° C. to 10° C. being still more preferred. In the Scheme 2 method in particular, the use of a two-stage process consisting of a first step involving reaction at from −50° C. to 50° C., followed by a second step involving reaction at from 60° C. to 150° C. is preferred.

In each of the above reactions, the ingredients may be added in any order. However, in the Scheme 1 reaction, the best method is to heat a solution containing either the cyanuric halide (18) or the diamino compound (19) and the organic solvent to a temperature of from 60° C. to 150° C., and preferably from 80° C. to 150° C., then add the remaining ingredient, the diamino compound (19) or the cyanuric halide (18), to the resulting solution at this temperature. In this case, either ingredient may be used as the ingredient which is initially dissolved in the solvent or as the ingredient which is subsequently added, although a method wherein the cyanuric halide (18) is added to a heated solution of the diamino compound (19) is preferred.

In the Scheme 2 reactions, either ingredient may be used as the ingredient which is initially dissolved in the solvent or as the ingredient which is subsequently added, although a method wherein the diamino compound (19) is added to a cooled solution of the cyanuric halide (18) is preferred. The subsequently added ingredient may be added neat or may be added as a solution of the ingredient dissolved in an organic solvent such as any of those mentioned above. However, taking into account the ease of operation and the controllability of the reaction, the latter approach is preferred.

Also, addition may be carried out gradually such as in a dropwise manner, or the entire amount may be added all at once in a batchwise manner.

In Scheme 1, even when the reaction is carried out in a single stage after both compounds have been mixed together in a heated state (that is, without raising the temperature in a stepwise fashion), the desired triazine ring-containing hyperbranched polymer can be obtained without gelation.

In the Scheme 1 reaction and the second stage reaction in Scheme 2, various bases which are commonly used during or after polymerization may be added. Illustrative examples of such bases include potassium carbonate, potassium hydroxide, sodium carbonate, sodium hydroxide, sodium hydrogen carbonate, sodium ethoxide, sodium acetate, lithium carbonate, lithium hydroxide, lithium oxide, potassium acetate, magnesium oxide, calcium oxide, barium hydroxide, trilithium phosphate, trisodium phosphate, tripotassium phosphate, cesium fluoride, aluminum oxide, ammonia, trimethylamine, triethylamine, diisopropylamine, diisopropylethylamine, N-methylpiperidine, 2,2,6,6-tetramethyl-N-methylpiperidine, pyridine, 4-dimethylaminopyridine and N-methylmorpholine.

The amount of base added per equivalent of the cyanuric halide (18) is preferably from 1 to 100 equivalents, and more preferably from 1 to 10 equivalents. These bases may be used in the form of an aqueous solution.

In the methods of both schemes, following reaction completion, the product can be easily purified by a suitable technique such as reprecipitation.

Also, in the present invention, some portion of the halogen atoms on at least one terminal triazine ring may be capped with, for example, an alkyl, aralkyl, aryl, alkylamino, alkoxysilyl-containing alkylamino, aralkylamino, arylamino, alkoxy, aralkyloxy, aryloxy or ester group.

Of these, alkylamino, alkoxysilyl-containing alkylamino, aralkylamino and arylamino groups are preferred. Alkylamino and arylamino groups are more preferred. Arylamino groups are even more preferred.

The above alkyl groups and alkoxy groups are exemplified in the same way as described earlier in the specification.

Illustrative examples of ester groups include methoxycarbonyl and ethoxycarbonyl.

Illustrative examples of aryl groups include phenyl, o-chlorophenyl, m-chlorophenyl, p-chlorophenyl, o-fluorophenyl, p-fluorophenyl, o-methoxyphenyl, p-methoxyphenyl, p-nitrophenyl, p-cyanophenyl, α-naphthyl, β-naphthyl, o-biphenylyl, m-biphenylyl, p-biphenylyl, 1-anthryl, 2-anthryl, 9-anthryl, 1-phenanthryl, 2-phenanthryl, 3-phenanthryl, 4-phenanthryl and 9-phenanthryl.

Illustrative examples of aralkyl groups include benzyl, p-methylphenylmethyl, m-methylphenylmethyl, o-ethylphenylmethyl, m-ethylphenylmethyl, p-ethylphenylmethyl, 2-propylphenylmethyl, 4-isopropylphenylmethyl, 4-isobutylphenylmethyl and α-naphthylmethyl.

Illustrative examples of alkylamino groups include methylamino, ethylamino, n-propylamino, isopropylamino, n-butylamino, isobutylamino, s-butylamino, t-butylamino, n-pentylamino, 1-methyl-n-butylamino, 2-methyl-n-butylamino, 3-methyl-n-butylamino, 1,1-dimethyl-n-propylamino, 1,2-dimethyl-n-propylamino, 2,2-dimethyl-n-propylamino, 1-ethyl-n-propylamino, n-hexylamino, 1-methyl-n-pentylamino, 2-methyl-n-pentylamino, 3-methyl-n-pentylamino, 4-methyl-n-pentylamino, 1,1-dimethyl-n-butylamino, 1,2-dimethyl-n-butylamino, 1,3-dimethyl-n-butylamino, 2,2-dimethyl-n-butylamino, 2,3-dimethyl-n-butylamino, 3,3-dimethyl-n-butylamino, 1-ethyl-n-butylamino, 2-ethyl-n-butylamino, 1,1,2-trimethyl-n-propylamino, 1,2,2-trimethyl-n-propylamino, 1-ethyl-1-methyl-n-propylamino and 1-ethyl-2-methyl-n-propylamino.

Illustrative examples of aralkylamino groups include benzylamino, methoxycarbonylphenylmethylamino, ethoxycarbonylphenylmethylamino, p-methylphenylmethylamino, m-methylphenylmethylamino, o-ethylphenylmethylamino, m-ethylphenylmethylamino, p-ethylphenylmethylamino, 2-propylphenylmethylamino, 4-isopropylphenylmethylamino, 4-isobutylphenylmethylamino, naphthylmethylamino, methoxycarbonylnaphthylmethylamino and ethoxycarbonylnaphthylmethylamino.

Illustrative examples of arylamino groups include phenylamino, methoxycarbonylphenylamino, ethoxycarbonylphenylamino, naphthylamino, methoxycarbonylnaphthylamino, ethoxycarbonylnaphthylamino, anthranylamino, pyrenylamino, biphenylamino, terphenylamino and fluorenylamino.

Alkoxysilyl-containing alkylamino groups are exemplified by monoalkoxysilyl-containing alkylamino groups, dialkoxysilyl-containing alkylamino groups and trialkoxysilyl-containing alkylamino groups. Illustrative examples include 3-trimethoxysilylpropylamino, 3-triethoxysilylpropylamino, 3-dimethylethoxysilylpropylamino, 3-methyldiethoxysilylpropylamino, N-(2-aminoethyl)-3-dimethylmethoxysilylpropylamino, N-(2-aminoethyl)-3-methyldimethoxysilylpropylamino and N-(2-aminoethyl)-3-trimethoxysilylpropylamino.

Illustrative examples of aryloxy groups include phenoxy, naphthoxy, anthranyloxy, pyrenyloxy, biphenyloxy, terphenyloxy and fluorenyloxy.

Illustrative examples of aralkyloxy groups include benzyloxy, p-methylphenylmethyloxy, m-methylphenylmethyloxy, o-ethylphenylmethyloxy, m-ethylphenylmethyloxy, p-ethylphenylmethyloxy, 2-propylphenylmethyloxy, 4-isopropylphenylmethyloxy, 4-isobutylphenylmethyloxy and α-naphthylmethyloxy.

These groups can be easily introduced by substituting a halogen atom on a triazine ring with a compound that furnishes the corresponding substituent. For example, as shown in Scheme 3 below, by adding an aniline derivative and inducing a reaction, a hyperbranched polymer (21) having a phenylamino group on at least one end is obtained.

Scheme 3

[Chemical Formula 15]

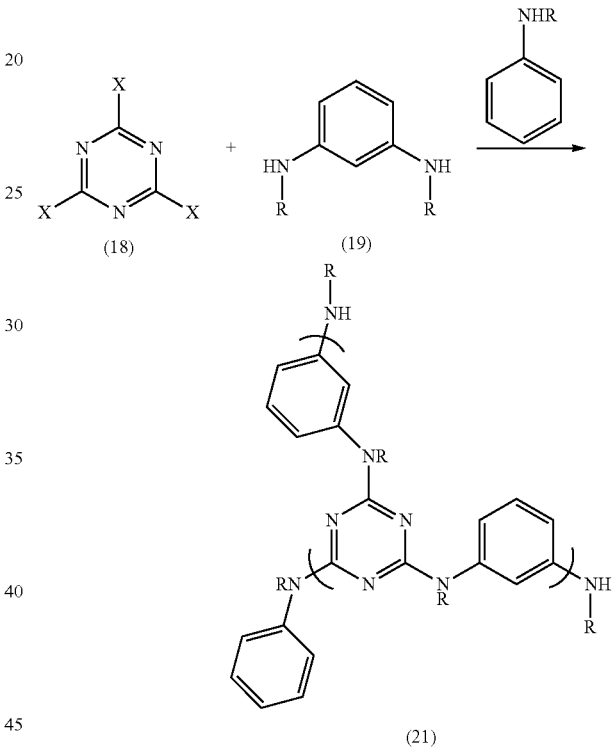

In these formulas, X and R are as defined above.

At this time, by reacting the cyanuric halide with a diaminoaryl compound while at the same time charging an organic monoamine, that is, in the presence of an organic monoamine, it is possible to obtain a flexible hyperbranched polymer having a low degree of branching in which the rigidity of the hyperbranched polymer has been diminished.

Because the hyperbranched polymer obtained in this way has an excellent solubility in a solvent (meaning that aggregation is inhibited) and has an excellent crosslinkability with a crosslinking agent, it is especially advantageous when used as a composition in combination with the subsequently described crosslinking agent.

An alkyl monoamine, aralkyl monoamine or aryl monoamine may be used here as the organic monoamine.

Illustrative examples of alkyl monoamines include methylamine, ethylamine, n-propylamine, isopropylamine, n-butylamine, isobutylamine, s-butylamine, t-butylamine, n-pentylamine, 1-methyl-n-butylamine, 2-methyl-n-butylamine, 3-methyl-n-butylamine, 1,1-dimethyl-n-propylamine, 1,2- dimethyl-n-propylamine, 2,2-dimethyl-n-propylamine, 1-ethyl-n-propylamine, n-hexylamine, 1-methyl-n-pentylamine, 2-methyl-n-pentylamine, 3-methyl-n-pentylamine, 4-methyl-n-pentylamine, 1,1-dimethyl-n-butylamine, 1,2-dimethyl-n-butylamine, 1,3-dimethyl-n-butylamine, 2,2-dimethyl-n-butylamine, 2,3-dimethyl-n-butylamine, 3,3-dimethyl-n-butylamine, 1-ethyl-n-butylamine, 2-ethyl-n-butylamine, 1,1,2-trimethyl-n-propylamine, 1,2,2-trimethyl-n-propylamine, 1-ethyl-1-methyl-n-propylamine, 1-ethyl-2-methyl-n-propylamine and 2-ethylhexylamine.

Illustrative examples of aralkyl monoamines include benzylamine, p-methoxycarbonylbenzylamine, p-ethoxycarbonylphenylbenzyl, p-methylbenzylamine, m-methylbenzylamine and o-methoxybenzylamine.

Illustrative examples of aryl monoamines include aniline, p-methoxycarbonylaniline, p-ethoxycarbonylaniline, p-methoxyaniline, 1-naphthylamine, 2-naphthylamine, anthranylamine, 1-aminopyrene, 4-biphenylylamine, o-phenylaniline, 4-amino-p-terphenyl and 2-aminofluorene.

In this case, the amount of organic monoamine used per equivalent of the cyanuric halide is set to preferably from 0.05 to 500 equivalents, more preferably from 0.05 to 120 equivalents, and even more preferably from 0.05 to 50 equivalents.

To suppress linearity and increase the degree of branching, the reaction temperature in this case is preferably from 60 to 150° C., more preferably from 80 to 150° C., and even more preferably from 80 to 120° C. However, mixing of the three ingredients, an organic monoamine, a cyanuric halide and a diaminoaryl compound, may be carried out at a low temperature, in which case the temperature is set to preferably from about −50° C. to about 50° C., more preferably from about −20° C. to about 50° C., and even more preferably from −20° C. to 10° C. After low-temperature charging, it is preferable to raise the temperature without interruption (i.e., in a single step) to the polymerization temperature and carry out the reaction.

Alternatively, the mixing of two ingredients, a cyanuric halide and a diaminoaryl compound, may be carried out at a low temperature, in which case the temperature is set to preferably from about −50° C. to about 50° C., more preferably from about −20° C. to about 50° C., and even more preferably from −20° C. to 10° C. After low-temperature charging, it is preferable to add the organic monoamine, raise the temperature without interruption (i.e., in a single step) to the polymerization temperature and carry out the reaction.

The reaction of the cyanuric halide with the diaminoaryl compound in the presence of such an organic monoamine may be carried out using an organic solvent like those mentioned above.

[Crosslinking Agent]

The crosslinking agent used in the film-forming composition of the invention is not particularly limited, provided it is a compound having a substituent capable of reacting with the polymer of the invention.

Such compounds are exemplified by polyfunctional vinyl ether compounds, polyfunctional allyl ether compounds, melamine compounds having crosslink-forming substituents such as methylol groups or methoxymethyl groups, substituted urea compounds, compounds having crosslink-forming substituents such as epoxy groups or oxetane groups, compounds containing blocked isocyanate groups, compounds containing acid anhydride groups, compounds having (meth)acryl groups, and phenoplast compounds. These compounds must have at least two crosslink-forming substituents on the molecule.

The polyfunctional vinyl ether compounds and polyfunctional allyl ether compounds are not particularly limited, provided they have two or more vinyl ether groups or allyl ether groups as curable groups per molecule. Ether compounds composed of a polyhydric alcohol and an alcohol having vinyl groups or allyl groups are preferred.

Illustrative examples of polyfunctional vinyl ether compounds include ethylene glycol divinyl ether, diethylene glycol divinyl ether, polyethylene glycol divinyl ether, propylene glycol divinyl ether, butylene glycol divinyl ether, hexanediol divinyl ether, bisphenol A alkylene oxide divinyl ether, bisphenol F alkylene oxide divinyl ether, trimethylolpropane trivinyl ether, ditrimethylolpropane tetravinyl ether, glycerol trivinyl ether, pentaerythritol tetravinyl ether, dipentaerythritol pentavinyl ether, dipentaerythritol hexavinyl ether, polyethylene glycol divinyl ether, pentaerythritol divinyl ether, pentaerythritol trivinyl ether, vinyl benzyl ether, pentaerythritol tetravinyl ether, 4-methoxyvinyl benzyl ether, 2-methoxyvinyl benzyl ether, 1,4-divinyloxymethylbenzene, ethylene oxide adducts of trimethylolpropane trivinyl ether, ethylene oxide adducts of ditrimethylolpropane tetravinyl ether, ethylene oxide adducts of pentaerythritol tetravinyl ether and ethylene oxide adducts of dipentaerythritol hexavinyl ether.

Illustrative examples of polyfunctional allyl ether compounds include ethylene glycol diallyl ether, diethylene glycol diallyl ether, polyethylene glycol diallyl ether, propylene glycol diallyl ether, butylene glycol diallyl ether, hexanediol diallyl ether, bisphenol A alkylene oxide diallyl ether, bisphenol F alkylene oxide diallyl ether, trimethylolpropane triallyl ether, ditrimethylolpropane tetraallyl ether, glycerol triallyl ether, pentaerythritol tetraallyl ether, dipentaerythritol pentaallyl ether, dipentaerythritol hexaallyl ether, polyethylene glycol diallyl ether, pentaerythritol diallyl ether, pentaerythritol triallyl ether, allyl benzyl ether, pentaerythritol tetraallyl ether, 4-methoxyallyl benzyl ether, 2-methoxyallyl benzyl ether, 1,4-diallyloxymethylbenzene, ethylene oxide adducts of trimethylolpropane triallyl ether, ethylene oxide adducts of ditrimethylolpropane tetraallyl ether, ethylene oxide adducts of pentaerythritol tetraallyl ether and ethylene oxide adducts of dipentaerythritol hexaallyl ether. Alternatively, use may be made of a commercial product such as T-20 or P-30M (both products of Daiso).

The polyfunctional epoxy compounds are not particularly limited, provided they have two or more epoxy groups on the molecule. Illustrative examples include tris(2,3-epoxypropyl) isocyanurate, 1,4-butanediol diglycidyl ether, 1,2-epoxy-4-(epoxyethyl)cyclohexane, glycerol triglycidyl ether, diethylene glycol diglycidyl ether, 2,6-diglycidylphenyl glycidyl ether, 1,1,3-tris[p-(2,3-epoxypropoxyl)phenyl] propane, 1,2-cyclohexanedicarboxylic acid diglycidyl ester, 4,4'-methylenebis(N,N-diglycidylaniline), 3,4-epoxycyclohexylmethyl-3,4-epoxycyclohexane carboxylate, trimethylolethane triglycidyl ether, bisphenol A diglycidyl ether and pentaerythritol polyglycidyl ether.

Examples of commercial products that may be used include epoxy resins having at least two epoxy groups, such as YH-434 and YH-434L (from Tohto Kasei Co., Ltd.); epoxy resins having a cyclohexene oxide structure, such as Epolead GT-401, GT-403, GT-301 and GT-302, and also Celloxide 2021 and Celloxide 3000 (all from Daicel Chemical Industries, Ltd.); bisphenol A-type epoxy resins such as Epikote (now "jER") 1001, 1002, 1003, 1004, 1007, 1009, 1010 and 828 (all from Japan Epoxy Resin Co., Ltd.); bisphenol F-type epoxy resins such as Epikote (now "jER") 807 (Japan Epoxy Resin Co., Ltd.); phenol-novolak type epoxy resins such as Epikote (now "jER") 152 and 154

(Japan Epoxy Resin Co., Ltd.), and EPPN 201 and 202 (Nippon Kayaku Co., Ltd.); cresol-novolak type epoxy resins such as EOCN-102, EOCN-103S, EOCN-104S, EOCN-1020, EOCN-1025 and EOCN-1027 (Nippon Kayaku Co., Ltd.), and Epikote (now "jER") 180S75 (Japan Epoxy Resin Co., Ltd.); alicyclic epoxy resins such as Denacol EX-252 (Nagase ChemteX Corporation), CY175, CY177 and CY179 (Ciba-Geigy AG), Araldite CY-182, CY-192 and CY-184 (Ciba-Geigy AG), Epiclon 200 and 400 (DIC Corporation), Epikote (now "jER") 871 and 872 (Japan Epoxy Resin Co., Ltd.), and ED-5661 and ED-5662 (Celanese Coating KK); and aliphatic polyglycidyl ethers such as Denacol EX-611, EX-612, EX-614, EX-622, EX-411, EX-512, EX-522, EX-421, EX-313, EX-314 and EX-321 (Nagase ChemteX Corporation).

The polyfunctional (meth)acrylic compounds are not particularly limited, provided they have two or more (meth) acryl groups on the molecule. Illustrative examples include ethylene glycol diacrylate, ethylene glycol dimethacrylate, polyethylene glycol diacrylate, polyethylene glycol dimethacrylate, ethoxylated bisphenol A diacrylate, ethoxylated bisphenol A dimethacrylate, ethoxylated trimethylolpropane triacrylate, ethoxylated trimethylolpropane trimethacrylate, ethoxylated glycerol triacrylate, ethoxylated glycerol trimethacrylate, ethoxylated pentaerythritol tetraacrylate, ethoxylated pentaerythritol tetramethacrylate, ethoxylated dipentaerythritol hexaacrylate, polyglycerol monoethylene oxide polyacrylate, polyglycerol polyethylene glycol polyacrylate, dipentaerythritol hexaacrylate, dipentaerythritol hexamethacrylate, neopentyl glycol diacrylate, neopentyl glycol dimethacrylate, pentaerythritol triacrylate, pentaerythritol trimethacrylate, trimethylolpropane triacrylate, trimethylolpropane trimethacrylate, tricyclodecane dimethanol diacrylate, tricyclodecane dimethanol dimethacrylate, 1,6-hexanediol diacrylate and 1,6-hexanediol dimethacrylate.

The polyfunctional (meth)acrylic compound may be acquired as a commercial product, illustrative examples of which include NK Ester A-200, A-400, A-600, A-1000, A-9300 (tris[2-(acryloyloxy)ethyl]isocyanurate), A-9300-1CL, A-TMPT, UA-53H, 1G, 2G, 3G, 4G, 9G, 14G, 23G, ABE-300, A-BPE-4, A-BPE-6, A-BPE-10, A-BPE-20, A-BPE-30, BPE-80N, BPE-100N, BPE-200, BPE-500, BPE-900, BPE-1300N, A-GLY-3E, A-GLY-9E, A-GLY-20E, A-TMPT-3EO, A-TMPT-9EO, ATM-4E and ATM-35E (all from Shin-Nakamura Chemical Co., Ltd.); KAYARAD™ DPEA-12, PEG400DA, THE-330 and RP-1040 (all from Nippon Kayaku Co., Ltd.); M-210 and M-350 (from Toagosei Co., Ltd.); KAYARAD™ DPHA, NPGDA and PET30 (Nippon Kayaku Co., Ltd.); NK Ester A-DPH, A-TMPT, A-DCP, A-HD-N, TMPT, DCP, NPG and HD-N (all from Shin-Nakamura Chemical Co., Ltd.); NK Oligo U-15HA (Shin-Nakamura Chemical Co., Ltd.); and NK Polymer Vanaresin GH-1203 (Shin-Nakamura Chemical Co., Ltd.).

The acid anhydride compounds are not particularly limited, provided they are carboxylic acid anhydrides obtained by the dehydration/condensation of two molecules of carboxylic acid. Illustrative examples include those having one acid anhydride group on the molecule, such as phthalic anhydride, tetrahydrophthalic anhydride, hexahydrophthalic anhydride, methyl tetrahydrophthalic anhydride, methyl hexahydrophthalic anhydride, nadic anhydride, methyl nadic anhydride, maleic anhydride, succinic anhydride, octyl succinic anhydride and dodecenyl succinic anhydride; and those having two acid anhydride groups on the molecule, such as 1,2,3,4-cyclobutanetetracarboxylic dianhydride, pyromellitic anhydride, 3,4-dicarboxy-1,2,3,4-tetrahydro-1-naphthalenesuccinic dianhydride, bicyclo[3.3.0]octane-2,4,6,8-tetracarboxylic dianhydride, 5-(2,5-dioxotetrahydro-3-furanyl)-3-methyl-3-cyclohexene-1,2-dicarboxylic anhydride, 1,2,3,4-butanetetracarboxylic dianhydride, 3,3',4,4'-benzophenonetetracarboxylic dianhydride, 3,3',4,4'-biphenyltetracarboxylic dianhydride, 2,2-bis(3,4-dicarboxyphenyl)hexafluoropropane dianhydride and 1,3-dimethyl-1,2,3,4-cyclobutanetetracarboxylic dianhydride.

The compounds containing blocked isocyanate groups are not particularly limited, provided they are compounds having on the molecule at least two blocked isocyanate groups, i.e., isocyanate groups (—NCO) that have been blocked with suitable protecting groups, and in which, upon exposure of the compound to an elevated temperature during heat curing, the protecting groups (blocking moieties) are removed by thermal dissociation and the isocyanate groups that form as a result induce crosslinking reactions with the resin. Such compounds are exemplified by compounds having on the molecule at least two groups of the following formula (which groups may be the same or may each differ).

[Chemical Formula 16]

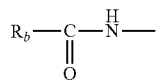

In the formula, $R_b$ is an organic group on the blocking moiety.

Such a compound can be obtained by, for example, reacting a suitable blocking agent with a compound having at least two isocyanate groups on the molecule.

Illustrative examples of compounds having at least two isocyanate groups on the molecule include polyisocyanates such as isophorone diisocyanate, 1,6-hexamethylene diisocyanate, methylenebis(4-cyclohexyl isocyanate) and trimethylhexamethylene diisocyanate, and also dimers and trimers thereof, as well as the reaction products of these with diols, triols, diamines or triamines.

Illustrative examples of the blocking agent include alcohols such as methanol, ethanol, isopropanol, n-butanol, 2-ethoxyhexanol, 2-N,N-dimethylaminoethanol, 2-ethoxyethanol and cyclohexanol; phenols such as phenol, o-nitrophenol, p-chlorophenol, and o-, m- and p-cresol; lactams such as ε-caprolactam; oximes such as acetone oxime, methyl ethyl ketone oxime, methyl isobutyl ketone oxime, cyclohexanone oxime, acetophenone oxime and benzophenone oxime; pyrazoles such as pyrazole, 3,5-dimethylpyrazole and 3-methylpyrazole; and thiols such as dodecanethiol and benzenethiol.

The compound containing blocked isocyanate groups may also be acquired as a commercial product, illustrative examples of which include B-830, B-815N, B-842N, B-870N, B-874N, B-882N, B-7005, B7030, B-7075 and B-5010 (all from Mitsui Chemicals Polyurethane, Inc.); Duranate® 17B-60PX, TPA-B80E, MF-B60X, MF-K60X and E402-B80T (all from Asahi Kasei Chemicals Corporation); and KarenzMOI-BM® (Showa Denko KK).

The aminoplast compounds are not particularly limited, provided they are compounds which have at least two methoxymethylene groups on the molecule. Illustrative examples include the following melamine compounds: compounds of the Cymel® series, such as hexamethoxymethylmelamine (Cymel® 303), tetrabutoxymethylglycoluril (Cymel® 1170) and tetramethoxymethylbenzoguanamine (Cymel® 1123) (all from Nihon Cytec Industries, Inc.); and compounds of the Nikalac® series, including the methylated melamine resins Nikalac® MW-30HM, MW-390, MW-100LM and MX-750LM, and the methylated urea resins Nikalac® MX-270, MX-280 and MX-290 (all from Sanwa Chemical Co., Ltd.).

The oxetane compounds are not particularly limited, provided they are compounds which have at least two oxetanyl groups on the molecule. Examples include the oxetane group-bearing compounds OXT-221, OX-SQ-H and OX-SC (from Toagosei Co., Ltd.).

Phenoplast compounds are compounds which have at least two hydroxymethylene groups on the molecule. Upon exposure to an elevated temperature during heat curing, crosslinking reactions proceed by way of dehydration/condensation reactions with the polymer of the invention.

Illustrative examples of phenoplast compounds include 2,6-dihydroxymethyl-4-methylphenol, 2,4-dihydroxymethyl-6-methylphenol, bis(2-hydroxy-3-hydroxymethyl-5-methylphenyl)methane, bis(4-hydroxy-3-hydroxymethyl-5-methylphenyl)methane, 2,2-bis(4-hydroxy-3,5-dihydroxymethylphenyl)propane, bis(3-formyl-4-hydroxyphenyl)methane, bis(4-hydroxy-2,5-dimethylphenyl)formylmethane and α,α-bis(4-hydroxy-2,5-dimethylphenyl)-4-formyltoluene.

The phenoplast compound may also be acquired as a commercial product, illustrative examples of which include 26DMPC, 46DMOC, DM-BIPC-F, DM-BIOC-F, TM-BIP-A, BISA-F, BI25X-DF and BI25X-TPA (all from Asahi Organic Chemicals Industry Co., Ltd.).

Of these, in terms of an ability to suppress a decline in refractive index by including a crosslinking agent and also a high solvent resistance and a low-temperature heat-curing ability, polyfunctional vinyl ether compounds and polyfunctional allyl ether compounds are preferred. In terms of heat resistance and storage stability, compounds having epoxy groups, blocked isocyanate groups or (meth)acryl groups are preferred. In terms of providing a photocurable composition without the use of an initiator, polyfunctional epoxy compounds and/or polyfunctional (meth)acrylic compounds are preferred.

In terms of an ability to suppress a decline in refractive index by including the crosslinking agent and also rapid promotion of the curing reaction, polyfunctional (meth)acrylic compounds are preferred. In particular, owing to their excellent compatibility with triazine ring-containing polymers, polyfunctional (meth)acrylic compounds having the isocyanuric acid skeleton described below are more preferred.

Polyfunctional (meth)acrylic compounds having such skeletons are exemplified by NK Ester A-9300 and A-9300-1CL (both of which are from Shin-Nakamura Chemical Co., Ltd.).

[Chemical Formula 17]

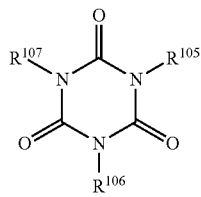

In the above formula, $R^{105}$ to $R^{107}$ are each independently a monovalent organic group having at least one terminal (meth)acryl group.

To further enhance the rate of cure and also increase the solvent resistance, acid resistance and alkali resistance of the resulting cured film, it is advantageous to use a polyfunctional (meth)acrylic compound which at 25° C. is a liquid and has a viscosity of 5,000 mPa·s or less, preferably from 1 to 3,000 mPa·s, more preferably from 1 to 1,000 mPa·s, and even more preferably from 1 to 500 mPa·s (referred to below as a "low-viscosity crosslinking agent"), either singly or as a combination of two or more thereof, or in combination with the above-described polyfunctional (meth)acrylic compound having an isocyanuric acid skeleton.

Such a low-viscosity crosslinking agent too may be acquired as a commercial product. Illustrative examples include, of the above-mentioned polyfunctional (meth)acrylic compounds, crosslinking agents in which the chain lengths between (meth)acryl groups are relatively long, such as NK Ester A-GLY-3E (85 mPa·s at 25° C.), A-GLY-9E (95 mPa·s at 25° C.), A-GLY-20E (200 mPa·s at 25° C.), A-TMPT-3EO (60 mPa·s at 25° C.), A-TMPT-9EO, ATM-4E (150 mPa·s at 25° C.) and ATM-35E (350 mPa·s at 25° C.) (all from Shin-Nakamura Chemical Co., Ltd.).

In addition, to enhance the alkali resistance of the resulting cured film, it is preferable to use a combination of NK Ester A-GLY-20E (Shin-Nakamura Chemical Co., Ltd.) and the above-described polyfunctional (meth)acrylic compound having an isocyanuric acid skeleton.

The above crosslinking agent may be used singly or two or more may be used in combination. The amount of crosslinking agent used per 100 parts by weight of the triazine ring-containing polymer is preferably from 1 to 100 parts by weight. From the standpoint of solvent resistance, the lower limit is preferably 2 parts by weight, and more preferably 5 parts by weight. From the standpoint of control of the refractive index, the upper limit is preferably 20 parts by weight, and more preferably 15 parts by weight.

Initiators corresponding to the respective crosslinking agents may also be included in the film-forming composition of the invention. As noted above, when a polyfunctional epoxy compound and/or a polyfunctional (meth)acrylic compound are used as crosslinking agents, photocuring is promoted even without the use of an initiator, giving a cured film, although it is acceptable to use an initiator in such cases.

In cases where a polyfunctional vinyl ether compound, a polyfunctional allyl ether compound or a polyfunctional epoxy compound is used as the crosslinking agent, a photoacid generator or a photobase generator may be used as the initiator. Use may also be made of a thermal acid generator, thus making heat curing possible.

The photoacid generator used may be one that is suitably selected from among known photoacid generators. For example, use may be made of onium salt derivatives such as diazonium salts, sulfonium salts and iodonium salts. Illustrative examples include aryldiazonium salts such as phenyldiazonium hexafluorophosphate, 4-methoxyphenyldiazonium hexafluoroantimonate and 4-methylphenyldiazonium hexafluorophosphate; diaryliodonium salts such as diphenyliodonium hexafluoroantimonate, di(4-methylphenyl)iodonium hexafluorophosphate and di(4-tert-butylphenyl)iodonium hexafluorophosphate; and triarylsulfonium salts such as triphenylsulfonium hexafluoroantimonate, tris(4-methoxyphenyl)sulfonium hexafluorophosphate, diphenyl-4-thiophenoxyphenylsulfonium hexafluoroantimonate, diphenyl-4-thiophenoxyphenylsulfonium hexafluorophosphate, 4,4'-bis(diphenylsulfonio)phenylsulfide bishexafluoroantimonate, 4,4'-bis(diphenylsulfonio)phenylsulfide bishexafluorophosphate, 4,4'-bis[di(β-hydroxyethoxy)phenylsulfonio]phenylsulfide bishexafluoroantimonate, 4,4'-bis[di(β-hydroxyethoxy)phenylsulfonio]phenylsulfide bishexafluorophosphate, 4-[4'-(benzoyl)phenylthio]phenyl-di(4-fluorophenyl)sulfonium hexafluoroantimonate and 4-[4'-(benzoyl)phenylthio]phenyl-di(4-fluorophenyl)sulfonium hexafluorophosphate.

Commercial products may be used as these onium salts. Illustrative examples include San-Aid SI-60, SI-80, SI-100, SI-60L, SI-80L, SI-100L, SI-L145, SI-L150, SI-L160, SI-L110 and SI-L147 (all available from Sanshin Chemical Industry Co., Ltd.); UVI-6950, UVI-6970, UVI-6974, UVI-6990 and UVI-6992 (all available from Union Carbide); CPI-100P, CPI-100A, CPI-200K and CPI-200S (all available from San-Apro Ltd.); Adeka Optomer SP-150, SP-151, SP-170 and SP-171 (all available from Adeka Corporation); Irgacure 261 (BASF); CI-2481, CI-2624, CI-2639 and CI-2064 (Nippon Soda Co., Ltd.); CD-1010, CD-1011 and CD-1012 (Sartomer Company); DS-100, DS-101, DAM-101, DAM-102, DAM-105, DAM-201, DSM-301, NAI-100, NAI-101, NAI-105, NAI-106, SI-100, SI-101, SI-105, SI-106, PI-105, NDI-105, BENZOIN TOSYLATE, MBZ-101, MBZ-301, PYR-100, PYR-200, DNB-101, NB-101, NB-201, BBI-101, BBI-102, BBI-103 and BBI-109 (all from Midori Kagaku Co., Ltd.); PCI-061T, PCI-062T, PCI-020T and PCI-022T (all from Nippon Kayaku Co., Ltd.); and IBPF and IBCF (Sanwa Chemical Co., Ltd.).

The photobase generator used may be one selected from among known photobase generators. For example, use may be made of Co-amine complex-type, oxime carboxylic acid ester-type, carbamic acid ester-type and quaternary ammonium salt-type photobase generators. Illustrative examples include 2-nitrobenzylcyclohexyl carbamate, triphenylmethanol, 0-carbamoylhydroxylamide, 0-carbamoyloxime, [[(2,6-dinitrobenzyl)oxy]carbonyl]cyclohexylamine, bis[[(2-nitrobenzyl)oxy]carbonyl]hexane-1,6-diamine, 4-(methylthiobenzoyl)-1-methyl-1-morpholinoethane, (4-morpholinobenzoyl)-1-benzyl-1-dimethylaminopropane, N-(2-nitrobenzyloxycarbonyl)pyrrolidine, hexaamminecobalt(III) tris(triphenylmethylborate), 2-benzyl-2-dimethylamino-1-(4-morpholinophenyl)butanone, 2,6-dimethyl-3,5-diacetyl-4-(2'-nitrophenyl)-1,4-dihydropyridine and 2,6-dimethyl-3,5-diacetyl-4-(2',4'-dinitrophenyl)-1,4-dihydropyridine.

A commercial product may be used as the photobase generator. Illustrative examples include TPS-OH, NBC-101 and ANC-101 (all available under these product names from Midori Kagaku Co., Ltd.).

The thermal acid generator used may be one selected from among known thermal acid generators. For example, cationic or protonic acid catalysts such as trifluoromethanesulfonates, boron trifluoride-ether complex compounds and boron trifluoride may be used. Illustrative examples include diethylammonium trifluoromethanesulfonate, triethylammonium trifluoromethanesulfonate, diisopropylammonium trifluoromethanesulfonate and ethyldiisopropylammonium trifluoromethanesulfonate. Among aromatic onium salts used as acid generators are some which generate a cationic species under the effect of heat; these too may be used as thermal cationic polymerization initiators. Illustrative examples include San-Aid SI-45, SI-47, SI-60, SI-60L, SI-80, SI-80L, SI-100, SI-100L, SI-110L, SI-145, I-150, SI-160, SI-180L, SI-B3, SI-B3A (all available from Sanshin Chemical Industry Co., Ltd.). Other examples include CI-2921, CI-2920, CI-2946, CI-3128, CI-2624, CI-2639 and CI-2064 (Nippon Soda Co., Ltd.); CP-66 and CP-77 (Adeka Corporation); FC-520 (3M Company); and K-PURE TAG-2396, TAG-27135, TAG-2713, TAG-2172, TAG-2179, TAG-2168E, TAG-2722, TAG-2507, TAG-2678, TAG-2681, TAG-2690, TAG-2700, TAG-2710, TAG-2100, CDX-3027, CXC-1615, CXC-1616, CXC-1750, CXC-1738, CXC-1614, CXC-1742, CXC-1743, CXC-1613, CXC-1739, CXC-1751, CXC-1766, CXC-1763, CXC-1736 and CXC-1756 (all from King Industries, Inc.).

In cases where a photoacid or photobase generator is used for a polyfunctional epoxy compound, the generator is used in the range of preferably 0.1 to 15 parts by weight, and more preferably 1 to 10 parts by weight, per 100 parts by weight of the polyfunctional epoxy compound. Also, from 1 to 100 parts by weight of an epoxy resin curing agent may optionally be included per 100 parts by weight of the polyfunctional epoxy compound.

In cases where a thermal acid generator is used, the generator is used in the range of preferably from 0.1 to 50 parts by weight, and more preferably from 1 to 20 parts by weight, per 100 parts by weight of crosslinking agent.

In cases where a polyfunctional (meth)acrylic compound is used, a photoradical initiator may also be used.

A known photoradical initiator may be suitably selected and used for this purpose. Exemplary photoradical initiators include acetophenones, benzophenones, Michler's benzoyl benzoate, amyloxime ester, tetramethylthiuram monosulfide and thioxanthones.

Photocleavable photoradical initiators are especially preferred. Photocleavable photoradical initiators are listed on page 159 of Saishin UV K•ka Gijutsu [Recent UV Curing Technology] (publisher, K. Takausu; published by Gijutsu Joho Kyokai KK; 1991).

Examples of commercial photoradical initiators include those available from BASF under the trade names Irgacure 184, 369, 651, 500, 819, 907, 784, 2959, CGI1700, CGI1750, CGI1850 and CG24-61, and the trade names Darocur 1116 and 1173; that available from BASF under the trade name Lucirin TPO; that available from UCB under the trade name Ubecryl P36; and those available under the trade names Esacure KIP150, KIP65LT, KIP100F, KT37, KT55, KT046 and KIP75/B from the Fratelli Lamberti Company.

The photoradical initiator is used in the range of preferably from 0.1 to 15 parts by weight, and more preferably from 1 to 10 parts by weight, per 100 parts by weight of the polyfunctional (meth)acrylic compound.

[Organic Monomer]

The film-forming composition of the invention additionally includes an organic monomer capable of providing a linear polymer of formula (A) below.

[Chemical Formula 18]

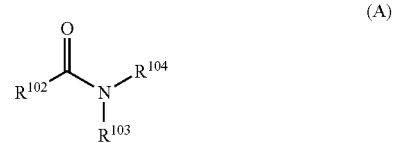

(A)

In formula (A), $R^{102}$ and $R^{104}$ are each independently a hydrogen atom, an alkyl group of 1 to 10 carbons or a polymerizable carbon-carbon double bond-containing group; and $R^{103}$ is a hydrogen atom or an alkyl group of 1 to 10 carbons, with the proviso that either of $R^{102}$ and $R^{104}$ is a polymerizable carbon-carbon double bond-containing group but $R^{102}$ and $R^{104}$ are not both at the same time polymerizable carbon-carbon double bond-containing groups.

Of these, $R^{102}$ is preferably a hydrogen atom or a methyl group, and $R^{103}$, to ensure hydrogen bond formability with a triazine ring-containing polymer, is preferably a hydrogen atom.

The alkyl group of 1 to 10 carbons is preferably linear or branched. Illustrative examples include methyl, ethyl, n-propyl, isopropyl, n-butyl, isobutyl, s-butyl, t-butyl, n-pentyl, 1-methyl-n-butyl, 2-methyl-n-butyl, 3-methyl-n-butyl, 1,1-dimethyl-n-propyl, 1,2-dimethyl-n-propyl, 2,2-dimethyl-n-propyl, 1-ethyl-n-propyl, n-hexyl, 1-methyl-n-pentyl, 2-methyl-n-pentyl, 3-methyl-n-pentyl, 4-methyl-n-pentyl, 1,1-dimethyl-n-butyl, 1,2-dimethyl-n-butyl, 1,3-dimethyl-n-butyl, 2,2-dimethyl-n-butyl, 2,3-dimethyl-n-butyl, 3,3-dimethyl-n-butyl, 1-ethyl-n-butyl, 2-ethyl-n-butyl, 1,1,2-trimethyl-n-propyl, 1,2,2-trimethyl-n-propyl, 1-ethyl-1-methyl-n-propyl, 1-ethyl-2-methyl-n-propyl, n-heptyl, n-octyl, 2-ethylhexyl, n-nonyl and n-decyl.

Of these, alkyl groups of 1 to 5 carbons are preferred.

The polymerizable carbon-carbon double bond-containing group, although not particularly limited, is preferably a carbon-carbon double bond-containing hydrocarbon group (alkenyl group) having from 2 to 10 carbons, and preferably from 2 to 5 carbons. Illustrative examples include ethenyl (vinyl), n-1-propenyl, n-2-propenyl (allyl), 1-methylethenyl, n-1-butenyl, n-2-butenyl, n-3-butenyl, 2-methyl-1-propenyl, 2-methyl-2-propenyl, 1-ethylethenyl, 1-methyl-1-propenyl, 1-methyl-2-propenyl, n-1-pentenyl, n-2-pentenyl, n-3-pentenyl, n-4-pentenyl, 1-n-propylethenyl, 1-methyl-1-butenyl, 1-methyl-2-butenyl, 1-methyl-3-butenyl, 2-ethyl-2-propenyl, 2-methyl-1-butenyl, 2-methyl-2-butenyl, 2-methyl-3-butenyl, 3-methyl-1-butenyl, 3-methyl-2-butenyl, 3-methyl-3-butenyl, 1,1-dimethyl-2-propenyl, 1-i-propylethenyl, 1,2-dimethyl-1-propenyl, 1,2-dimethyl-2-propenyl, n-1-hexenyl, n-2-hexenyl, n-3-hexenyl, n-4-hexenyl, n-5-hexenyl, n-heptenyl, n-octenyl, n-noneyl and n-decenyl.

Illustrative examples of organic monomers of formula (A) include N-vinylformamide, N-vinylacetamide, N-allylformamide, N-allylacetamide, (meth) acrylamide, N-methyl (meth) acrylamide, N-dimethyl (meth) acrylamide, N-ethyl (meth) acrylamide, N-diisopropyl (meth) acrylamide, N-isopropyl (meth) acrylamide and N-diisopropyl (meth)acrylamide. Of these, N-vinylformamide is especially preferred.

The organic monomer has the function of increasing the cracking resistance of the cured film ultimately obtained. In addition, in the subsequently described solvent-free film-forming composition, it functions as a reactive diluting agent which, through film formation, becomes an ingredient of the cured film.

No particular limitation is imposed on the amount in which the organic monomer of formula (A) is used. However, to further increase the cracking resistance of the resulting cured film, this is preferably from 1 to 200 parts by weight per 100 parts by weight of the triazine ring-containing polymer. In terms of the cracking resistance of the cured film, the lower limit is preferably 5 parts by weight, and more preferably 10 parts by weight, and the upper limit is preferably 150 parts by weight, and more preferably 100 parts by weight.

When the organic monomer is used as a reactive diluting agent in the subsequently described solvent-free film-forming composition, the amount included, although not subject to any particular limitation, is preferably from 1 to 1,000 parts by weight per 100 parts by weight of the triazine ring-containing polymer. The lower limit is preferably 5 parts by weight, and more preferably 10 parts by weight. The upper limit is preferably 500 parts by weight, and more preferably 400 parts by weight.

[Solvent-Containing Film-Forming Composition]

Various solvents may be added to the film-forming composition of the invention and used to dissolve the triazine ring-containing polymer. In such cases, the solvent may be the same as or different from the solvent used during polymerization. The solvent is not particularly limited; any one or plurality of solvents may be selected and used for this purpose, so long as compatibility with the polymer is not lost.

Illustrative examples of such solvents include water, toluene, p-xylene, o-xylene, m-xylene, ethylbenzene, styrene, ethylene glycol dimethyl ether, propylene glycol monomethyl ether, ethylene glycol monomethyl ether, propylene glycol, propylene glycol monoethyl ether, ethylene glycol monoethyl ether, ethylene glycol monoisopropyl ether, ethylene glycol methyl ether acetate, propylene glycol monomethyl ether acetate, ethylene glycol ethyl ether acetate, diethylene glycol dimethyl ether, propylene glycol monobutyl ether, ethylene glycol monobutyl ether, diethylene glycol diethyl ether, dipropylene glycol monomethyl ether, diethylene glycol monomethyl ether, dipropylene glycol monoethyl ether, diethylene glycol monoethyl ether, triethylene glycol dimethyl ether, diethylene glycol monoethyl ether acetate, diethylene glycol, 1-octanol, ethylene glycol, hexylene glycol, trimethylene glycol, 1-methoxy-2-butanol, cyclohexanol, diacetone alcohol, furfuryl alcohol, tetrahydrofurfuryl alcohol, propylene glycol, benzyl alcohol, 1,3-butanediol, 1,4-butanediol, 2,3-butanediol, γ-butyrolactone, acetone, methyl ethyl ketone, methyl isopropyl ketone, diethyl ketone, methyl isobutyl ketone, methyl n-butyl ketone, cyclohexanone, ethyl acetate, isopropyl acetate, n-propyl acetate, isobutyl acetate, n-butyl acetate, ethyl lactate, methanol, ethanol, isopropanol, tert-butanol, allyl alcohol, n-propanol, 2-methyl-2-butanol, isobutanol, n-butanol, 2-methyl-1-butanol, 1-pentanol, 2-methyl-1-pentanol, 2-ethylhexanol, 1-methoxy-2-propanol, tetrahydrofuran, 1,4-dioxane, N,N-dimethylformamide, N,N-dimethylacetamide, N-methylpyrrolidone, 1,3-dimethyl-2-imidazolidinone, dimethylsulfoxide and N-cyclohexyl-2-pyrrolidinone. These may be used singly or two or more may be used in combination.

The concentration of solids in the film-forming composition is not particularly limited, so long as it is in a range that does not affect the storage stability, and may be suitably set in accordance with the target film thickness. Specifically, from the standpoint of solubility and storage stability, the solids concentration is preferably from 0.1 to 50 wt %, and more preferably from 0.1 to 40 wt %.

[Solvent-Free Film-Forming Composition]

The film-forming composition of the invention may be prepared in a solvent-free form that contains no solvent. In such a case, as mentioned above, the organic monomer capable of providing a linear monomer of formula (A) functions as a reactive diluent.

[Other Ingredients]

In addition to the triazine ring-containing polymer, the crosslinking agent and the organic monomer capable of providing a linear polymer, the film-forming composition of the invention may include also other ingredients, such as leveling agents and surfactants, provided doing so does not detract from the advantageous effects of the invention.

Illustrative examples of surfactants include the following nonionic surfactants: polyoxyethylene alkyl ethers such as polyoxyethylene lauryl ether, polyoxyethylene stearyl ether, polyoxyethylene cetyl ether and polyoxyethylene oleyl ether; polyoxyethylene alkylaryl ethers such as polyoxyethylene octylphenyl ether and polyoxyethylene nonylphenyl ether; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate and sorbitan tristearate; and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate; and additionally include fluorosurfactants such as those available under the trade names Eftop EF301, EF303 and EF352 (from Mitsubishi Materials Electronic Chemicals Co., Ltd. (formerly Jemco Inc.)), Megafac F171, F173, R-08, R-30 F-553, F-554, RS-75 and RS-72-K (DIC Corporation), Fluorad FC430 and FC431 (Sumitomo 3M, Ltd.), AsahiGuard AG710 and Surflon S-382, SC101, SC102, SC103, SC104, SC105 and SC106 (Asahi Glass Co., Ltd.); and also the organosiloxane polymers KP341 (Shin-Etsu Chemical Co., Ltd.) and BYK-302, BYK-307, BYK-322, BYK-323, BYK-330, BYK-333, BYK-370, BYK-375 and BYK-378 (BYK-Chemie Japan KK).

These surfactants may be used singly or two or more may be used in combination. The amount of surfactant used per 100 parts by weight of the triazine ring-containing polymer is preferably from 0.0001 to 5 parts by weight, more preferably from 0.001 to 1 part by weight, and even more preferably from 0.01 to 0.5 part by weight.

The other ingredients mentioned above may be added in any step during preparation of the inventive composition.

[Cured Film]

When using the film-forming composition of the invention to form a cured film, no particular limitation is imposed on the underlying layer. For example, the desired cured film may be formed by applying the inventive composition onto an organic film or base material such as an organic EL film, optionally heating to evaporate the solvent, and subsequently heating or carrying out light exposure to cure the composition.

Any suitable method may be used for applying the composition, such as spin coating, dipping, flow coating, inkjet printing, spraying, bar coating, gravure coating, slit coating, roll coating, transfer printing, brush coating, blade coating and air knife coating.

Illustrative examples of the base material include silicon, indium-tin oxide (ITO)-coated glass, indium zinc oxide (IZO)-coated glass, polyethylene terephthalate (PET), plastic, glass, quartz and ceramic. Use can also be made of a flexible base material having pliability.

When using a solvent-containing film-forming composition, the solvent is evaporated by heating. The temperature at which this is carried out, although not particularly limited, may be set to from 40 to 400° C. The process is not particularly limited. For example, evaporation may be effected using a hot plate or an oven, such evaporation being carried out under a suitable atmosphere, such as in open air, in nitrogen or another inert gas, or in a vacuum.

In cases where a solvent-free film-forming composition is used and a thermal acid generator is used as the initiator, it is possible to form a cured film by baking. The method for doing so, although not particularly limited, may entail using a hot plate or an oven to effect heating under a suitable atmosphere, such as in open air, in nitrogen or another inert gas, or in a vacuum. In such a case, curing is possible even at a low temperature, and may be carried out at a temperature of, for example, from 50 to 200° C., and preferably from 70 to 150° C. The bake time is preferably from 5 to 120 minutes, and more preferably from 5 to 60 minutes.

With regard to the bake temperature and time, conditions which are compatible with the processing steps for the target electronic device should be selected. Bake conditions should be selected in such a way that the physical values of the resulting film conform to the required characteristics of the electronic device.

The conditions in cases where exposure to light is carried out are also not particularly limited. For example, an exposure energy and time which are suitable for the triazine ring-containing polymer and crosslinking agent that are used may be employed.

Because the cured film of the invention that has been thus obtained is able to achieve a high heat resistance, high transparency, high refractive index, high solubility and low volume shrinkage, it can be advantageously used as a component in the fabrication of electronic devices such as liquid-crystal displays, organic EL displays, LEDs, solid-state image sensors, organic thin-film solar cells, dye-sensitized solar cells and organic thin-film transistors. Because such cured films are resistant to cracking, the inventive film-forming composition is particularly suitable for use as an embedding material applicable to a light-extracting layer in an organic EL device. Moreover, when a solvent-free film-forming composition is used, because a cured film can be formed on an organic film such as an organic EL film without degrading the organic film, the resulting cured film can be advantageously used as a light-extracting layer in a top-emission-type organic EL device.

In addition, the cured film of the invention can be advantageously used as the following solid-state image sensor components: embedding films and planarizing films on photodiodes, planarizing films before and after color filters, microlenses, and planarizing films and conformal films on microlenses.

To further increase the planarity of the resulting cured film, a composition obtained by removing the organic monomer capable of providing a linear polymer from the above-described film-forming composition and adding a solvent may be rendered into a planarizing material and, by using this material, a planarizing film may be additionally deposited on the cured film. Specific examples of the triazine ring-containing polymer, crosslinking agent and the like in this planarizing material, as well as the amounts in which these ingredients are included and the film-forming method, are as described above.

EXAMPLES

Synthesis Examples, Production Examples and Working Examples are given below to more concretely illustrate the invention, although the invention is not limited by these Examples. The instruments used for measurement in the Examples were as follows.

[$^1$H-NMR]
Instruments: Varian NMR System 400 NB (400 MHz)
  JEOL-ECA700 (700 MHz)
Solvent used in measurement: DMSO-d6
Reference material: Tetramethylsilane (TMS) (δ=0.0 ppm)
[GPC]
Instrument: HLC-8200 GPC (Tosoh Corporation)
Columns: Shodex KF-804L+KF-805L
Column temperature: 40° C.
Solvent: Tetrahydrofuran (THF)
Detector: UV (254 nm)

Calibration curve: polystyrene standard
[Ellipsometer]
Instrument: VASE multiple incident angle spectroscopic ellipsometer (JA Woollam Japan)
[Thermogravimetric/Differential Thermal Analyzer (TG-DTA)]
Instrument: TG-8120 (Rigaku Corporation)
Temperature ramp-up rate: 10° C./min
Measurement temperatures: 25° C. to 750° C.

Synthesis Example 1

Synthesis of Triazine Ring-Containing Hyperbranched Polymer

[Chemical Formula 19]

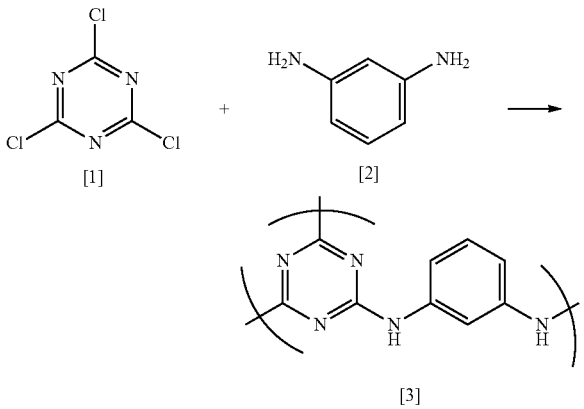

Under a nitrogen atmosphere, 456.02 g of dimethylacetamide (DMAc) was added to a 1,000 mL four-neck flask and cooled to −10° C. in an acetone-dry ice bath, following which 84.83 g (0.460 mol) of 2,4,6-trichloro-1,3,5-triazine [1] (Evonik Degussa) was added and dissolved therein. Next, a solution of 62.18 g (0.575 mol) of m-phenylenediamine [2] and 14.57 g (0.156 mol) of aniline dissolved in 304.01 g of DMAc was added dropwise. After dropwise addition, the flask contents were stirred for 30 minutes, then the reaction solution was added dropwise over a period of 1 hour using a fluid transfer pump to a reactor consisting of a 2,000 mL four-neck flask to which had already been added 621.85 g of DMAc and which was heated beforehand to 85° C. on an oil bath. Following addition, stirring was carried out for 1 hour, effecting polymerization.

Next, 113.95 g (1.224 mol) of aniline was added and the flask contents were stirred for 1 hour, bringing the reaction to completion. The system was cooled to room temperature in an ice bath, after which 116.36 g (1.15 mol) of triethylamine was added dropwise and 30 minutes of stirring was carried out, thereby quenching the hydrochloric acid. The hydrochloride that settled out was then removed by filtration. The filtered reaction mixture was reprecipitated in a mixed solution of 28% ammonia water (279.29 g) and 8,820 g of ion-exchanged water. The precipitate was filtered, dried in a vacuum desiccator at 150° C. for 8 hours, then redissolved in 833.1 g of THF and reprecipitated in 6,665 g of ion-exchanged water. The resulting precipitate was filtered, then dried in a vacuum desiccator at 150° C. for 25 hours, yielding 118.0 g of the target polymeric compound [3] (referred to below as "HB-TmDA40").

FIG. 1 shows the measured $^1$H-NMR spectrum for HB-TmDA40. The HB-TmDA40 thus obtained is a compound having structural units of formula (1). The polystyrene-equivalent weight-average molecular weight Mw of HB-TmDA40, as measured by GPC, was 4,300, and the polydispersity Mw/Mn was 3.44.

(1) Heat Resistance Test

Figure 2:
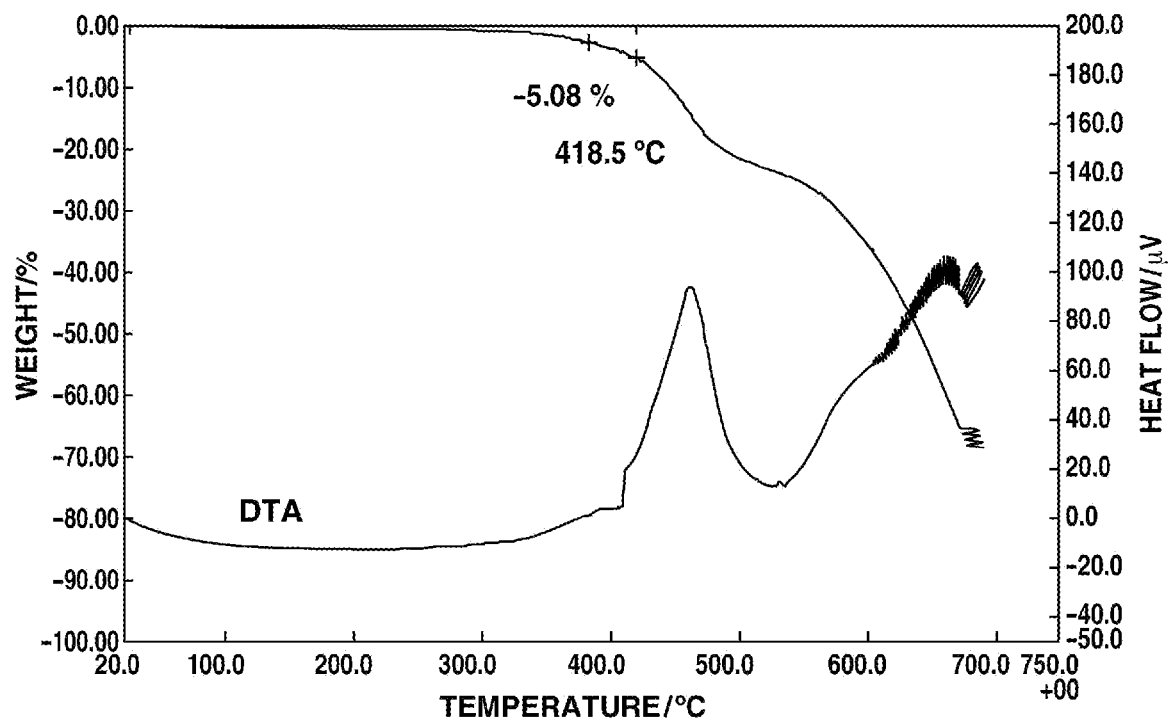
FIG. 2 is a plot showing the TG-DTA results for the polymeric compound [3] obtained in Synthesis Example 1.

TG-DTA measurement was carried out on the HB-TmDA40 obtained in Synthesis Example 1, whereupon the 5% weight loss temperature was 419° C. The results are shown in FIG. 2.

(2) Measurement of Refractive Index

The HB-TmDA40 obtained in Synthesis Example 1 (0.5 g) was dissolved in 4.5 g of cyclohexanone, giving a clear, light yellow-colored solution. Using a spin coater, the resulting polymer varnish was spin-coated onto a glass substrate at 200 rpm for 5 seconds and at 2,000 rpm for 30 seconds, following which the solvent was removed by heating at 150° C. for 1 minute and heating at 250° C. for 5 minutes, thereby giving a film. Upon measurement, the resulting film was found to have a refractive index at 550 nm of 1.790.

Production Example 1

A 25 wt % solution (referred to below as "HB-TmDA40V1") was prepared by dissolving 100 g of the HB-TmDA40 obtained in Synthesis Example 1 in a mixed solvent composed of 57.6 g of cyclohexanone, 230.4 g of propylene glycol monomethyl ether and 12 g of ion-exchanged water.

Production Example 2

A 25 wt % solution (referred to below as "HB-TmDA40V2") was prepared by dissolving 100 g of the HB-TmDA40 obtained in Synthesis Example 1 in a mixed solvent composed of 288.0 g of cyclohexanone and 12 g of ion-exchanged water.

Production Example 3

Planarizing Material
A varnish having a total solids concentration of 15 wt % (referred to below as "HB-TmDA40VF15") was prepared by initially preparing a 20 wt % cyclohexanone/ion-exchanged water (96:4, wt/wt) solution of the HB-TmDA40 obtained in Synthesis Example 1, then adding together 5.0 g of the solution, 0.03 g of ATM-35E (Shin-Nakamura Chemical Co., Ltd.), 0.1 g of A-GLY-20E (Shin-Nakamura Chemical Co., Ltd.), 0.05 g of the photoradical initiator Irgacure 184 (BASF), 0.0005 g of Megafac F-554 (DIC Corporation) and 2.23 g of cyclohexanone, and visually confirming that dissolution had occurred.

Production Example 4

A 20 wt % solution (referred to below as "HB-TmDA40V3") was prepared by dissolving 100 g of the HB-TmDA40 obtained in Synthesis Example 1 in a mixed solvent composed of 384.0 g of cyclohexanone and 16 g of ion-exchanged water.

Example 1

Embedding Material
A varnish having a total solids concentration of 32 wt % (referred to below as "HB-TmDA40VF1") was prepared by adding together 4 g of the HB-TmDA40V1 prepared in Production Example 1, 0.17 g of a 60 wt % cyclohexanone solution of ethoxylated glycerol triacrylate (A-GLY-20E, 200 mPa·s; from Shin-Nakamura Chemical Co., Ltd.), 0.05 g of a 60 wt % cyclohexanone solution of ethoxylated pentaerythritol tetraacrylate (ATM-35E, 350 mPa·s; from Shin-Nakamura Chemical Co., Ltd.), 1.17 g of a 60 wt % cyclohexanone solution of N-vinylformamide, 0.4 g of a 20 wt % cyclohexanone solution of the photoradical initiator Irgacure 184 (BASF), 0.05 g of a 1 wt % cyclohexanone solution of the surfactant Megafac R-30-N (DIC Corporation) and 0.14 g of cyclohexanone/PGME/ion-exchanged water (19:77:4, wt/wt/wt), and visually confirming that dissolution had occurred.

Example 2

Gap-Filling Performance Test 1

A gap-filling performance test was carried out by the following method using the HB-TmDA40VF1 varnish prepared in Example 1. The microstructure substrate used in the gap-filling performance test was made of silicon, had a thickness of 1.6 µm, and contained vias having a diameter of 400 nm.

The HB-TmDA40VF1 varnish was deposited as a film on the microstructure substrate by spin-coating to a target thickness of about 5 µm, and a 5-minute bake at 130° C. was carried out on a hot plate. Next, using a low-pressure mercury vapor lamp, the film was cured with a cumulative exposure dose of 400 mJ/cm$^2$, giving a cured film.

A diamond pen was used to marks the ends of the microstructure substrate on which a film had been formed, following which the substrate was cleaved and examined with a scanning electron microscope (SEM). The SEM image is shown in FIG. 3.

Figure 3:
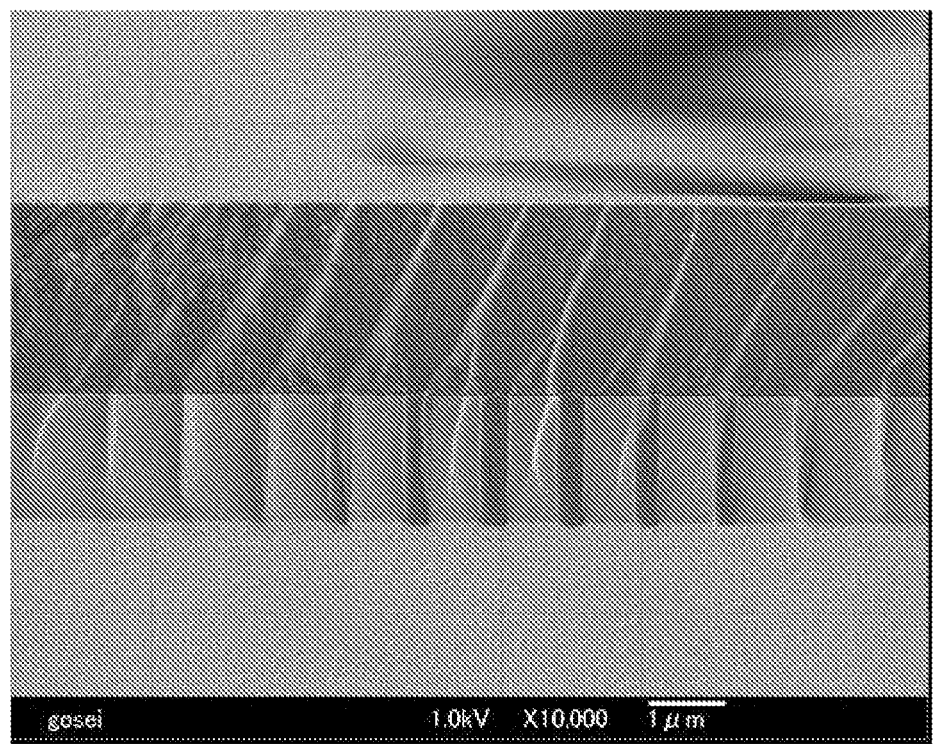
FIG. 3 is a scanning electron micrographic (SEM) image following cleavage of the substrate obtained in the gap-filling performance test in Example 2.

As is apparent in FIG. 3, the material reached the bottom of vias and the film thickness on top of the substrate was a full 3 µm. Hence, the results were indicative of the possibility that the HB-TmDA40VF1 varnish can be used as an embedding material capable of ensuring planarity.

Example 3

Gap-Filling Performance Test 2

Aside from using a silicon microstructure substrate having a thickness of 3.0 µm and containing vias with a diameter of 15 µm, a gap-filling performance test was carried out in the same way as in Example 2 using the HB-TmDA40VF1 varnish prepared in Example 1.

Figure 4:
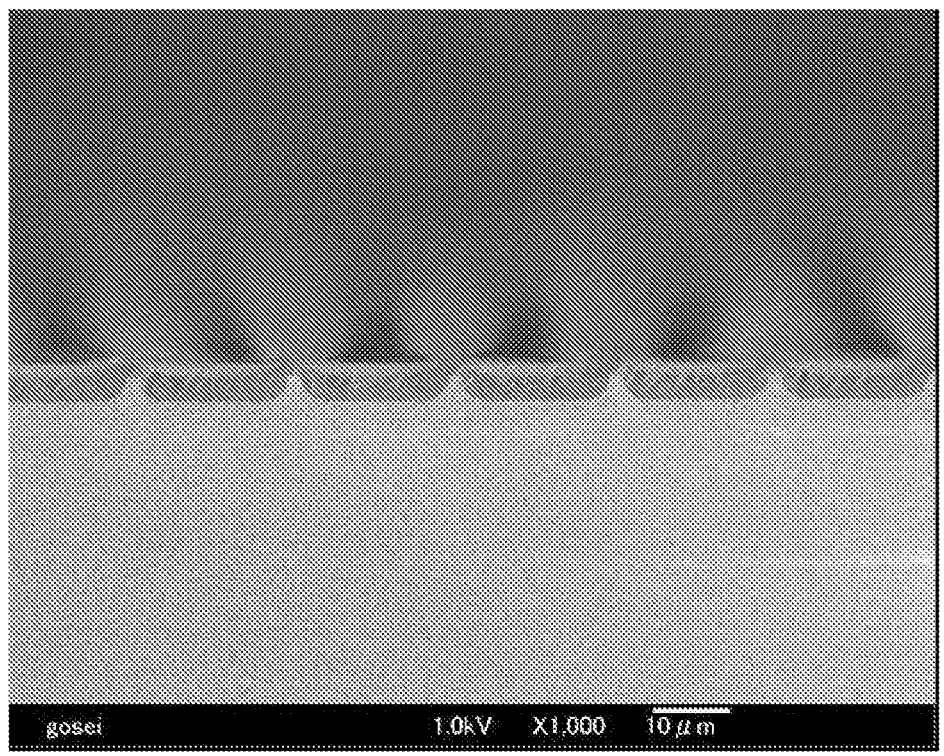
FIG. 4 is a SEM image following cleavage of the substrate obtained in the gap-filling performance test in Example 3.

A diamond pen was used to mark the ends of the microstructure substrate on which a film had been formed, following which the substrate was cleaved and examined with a scanning electron microscope. The SEM image is shown in FIG. 4.

Example 4

Gap-Filling Performance Test 3

A gap-filling performance test was carried out by the following method using the HB-TmDA40VF1 varnish prepared in Example 1. The microstructure substrate used in the gap-filling performance test was made of silicon, had a thickness of 3.0 µm, and contained vias having a diameter of 15 µm.

The HB-TmDA40VF1 varnish was spin-coated onto the microstructure substrate to a target thickness of about 5 µm, then subjected to a 5-minute bake at 130° C. on a hot plate.

In addition, to obtain planarity, the HB-TmDA40VF15 varnish prepared in Production Example 3 was spin-coated thereon to a target thickness of about 1 µm, then subjected to a 3-minute bake at 130° C. on a hot plate.

Next, using a low-pressure mercury vapor lamp, the film was cured with a cumulative exposure dose of 400 mJ/cm$^2$, giving a cured film.

Figure 5:
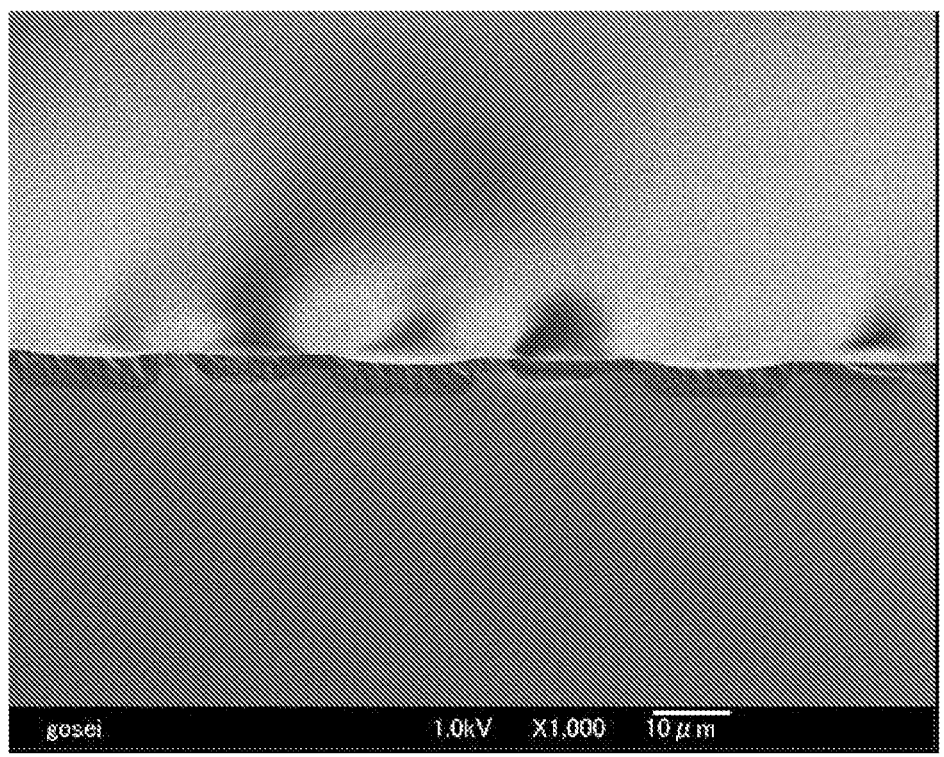
FIG. 5 is a SEM image following cleavage of the substrate obtained in the gap-filling performance test in Example 4.

A diamond pen was used to mark the ends of the microstructure substrate on which a film had been formed, following which the substrate was cleaved and examined with a scanning electron microscope. The SEM image is shown in FIG. 5.

Example 5

Gap-Filling Performance Test 4

A gap-filling performance test was carried out by the following method using the HB-TmDA40VF1 varnish prepared in Example 1. The microstructure substrate used in the gap-filling performance test was made of silicon, had a thickness of 3.0 µm, and contained vias having a diameter of 15 µm.

The HB-TmDA40VF1 varnish was spin-coated onto the microstructure substrate to a target thickness of about 5 µm, then subjected to a 5-minute bake at 130° C. on a hot plate. The same varnish was then formed as a film on the resulting dried film under the same conditions. In addition, to obtain planarity, the HB-TmDA40VF15 varnish prepared in Production Example 3 was spin-coated thereon to a target thickness of about 1 µm, then subjected to a 3-minute bake at 130° C. on a hot plate.

Next, using a low-pressure mercury vapor lamp, the film was cured with a cumulative exposure dose of 400 mJ/cm$^2$, giving a cured film.

A diamond pen was used to mark the ends of the microstructure substrate on which a film had been formed, following which the substrate was cleaved and examined with a scanning electron microscope. The SEM image is shown in FIG. 6.

Figure 6:
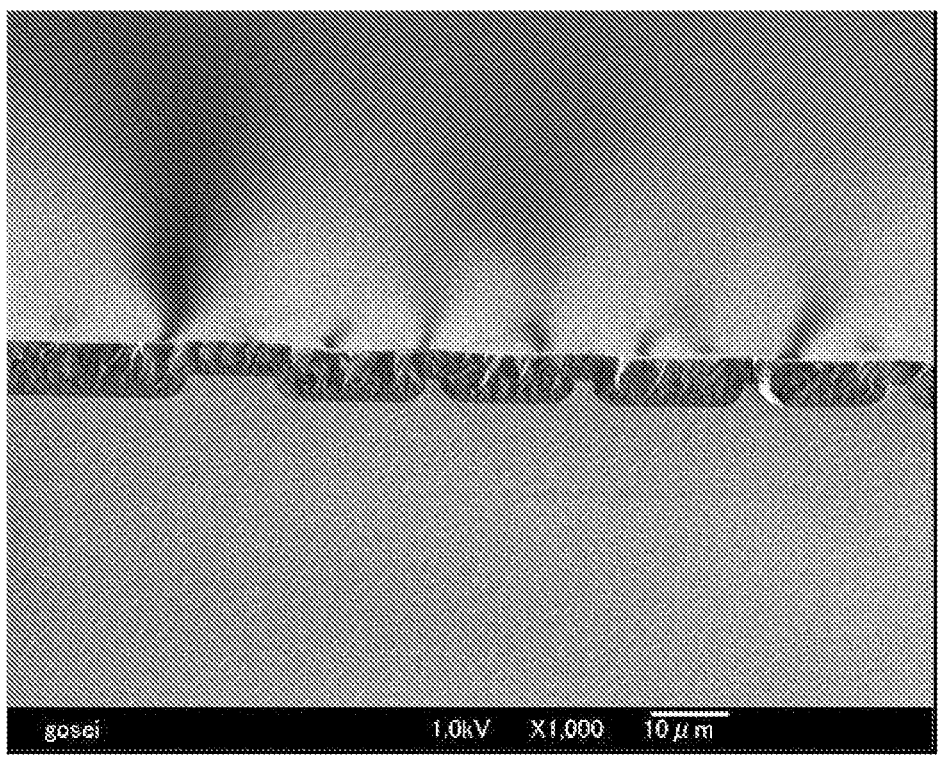
FIG. 6 is a SEM image following cleavage of the substrate obtained in the gap-filling performance test in Example 5.

As shown in FIGS. 4 to 6, it is apparent that embedding films which are free of cracks and have a high planarity can be produced.

Comparative Example 1

Embedding Material 2

A varnish having a total solids concentration of 22 wt % (referred to below as "HB-TmDA40VF2") was prepared by adding together 10 g of the HB-TmDA40V2 prepared in Production Example 2, 0.20 g of ethoxylated glycerol triacrylate (A-GLY-20E, 200 mPa·s; from Shin-Nakamura Chemical Co., Ltd.), 0.06 g of ethoxylated pentaerythritol tetraacrylate (ATM-35E, 350 mPa·s; from Shin-Nakamura Chemical Co., Ltd.), 0.10 g of the photoradical initiator Irgacure 184 (BASF), 0.10 g of a 1 wt % cyclohexanone solution of the surfactant Megafac R-554 (DIC Corporation) and 0.27 g of cyclohexanone/ion-exchanged water (96:4, wt/wt) for adjusting the concentration, and visually confirming that dissolution had occurred.

Comparative Example 2

Gap-Filling Performance Test 5

Using the HB-TmDA40VF2 prepared in Comparative Example 1, a gap-filling performance test was carried out in the same way as in Example 3.

A diamond pen was used to mark the ends of the microstructure substrate on which a film had been formed, following which the substrate was cleaved and examined with a scanning electron microscope. The SEM image is shown in FIG. 7.

Figure 7:
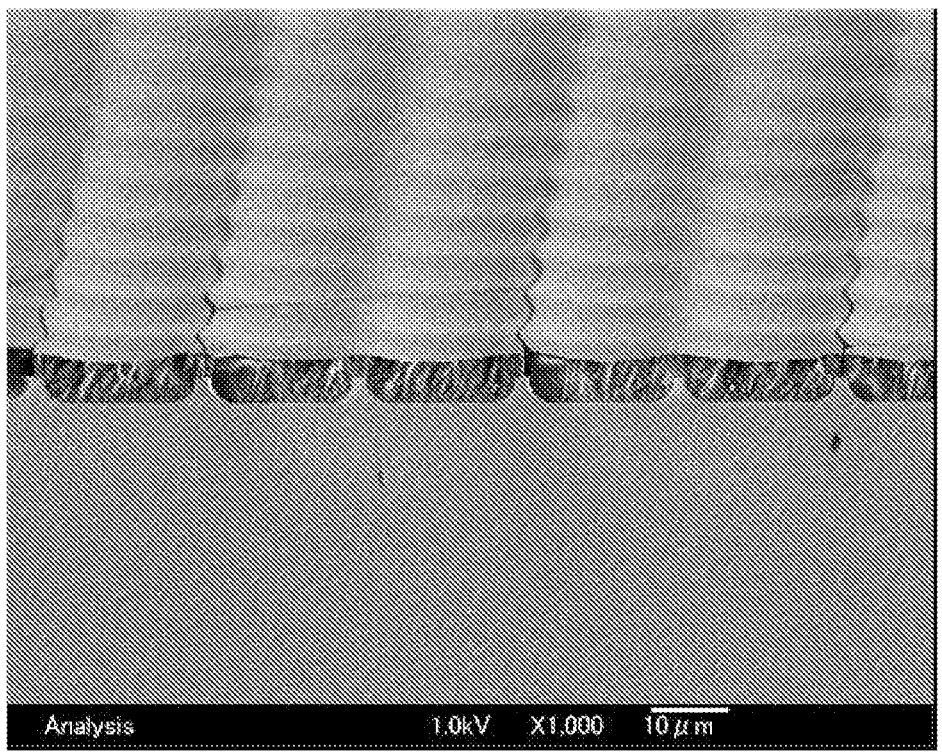
FIG. 7 is a SEM image following cleavage of the substrate obtained in the gap-filling performance test in Comparative Example 2.

It is apparent from FIG. 7 that cracks arose at the surface of the film formed from the embedding material of Comparative Example 1 in which an organic monomer capable of providing a linear polymer was not used.

Example 6

Refractive Index Measurement 1

A varnish having a total solids concentration of 15 wt % (adding the nonvolatile fraction (NVF) to the solids content, the total solids concentration was 18 wt %) (which varnish is referred to below as "HB-TmDA40VF3") was prepared by adding together 5.0 g of the HB-TmDA40V3 prepared in Production Example 4, 0.1 g of ethoxylated glycerol triacrylate (A-GLY-20E, 200 mPa·s; from Shin-Nakamura Chemical Co., Ltd.), 0.03 g of ethoxylated pentaerythritol tetraacrylate (ATM-35E, 350 mPa·s; from Shin-Nakamura Chemical Co., Ltd.), 0.05 g of the photoradical initiator Irgacure 184 (BASF), 0.01 g of a 5 wt % cyclohexanone solution of the surfactant Megafac R-554 (DIC Corporation), 0.25 g of N-vinylformamide (Tokyo Chemical Industry) and 2.43 g of cyclohexanone/ion-exchanged water (96:4, wt/wt) for adjusting the concentration, and visually confirming that dissolution had occurred.

Using a spin coater, the resulting HB-TmDA40VF3 varnish was spin-coated at 200 rpm for 5 seconds and at 1,500 rpm for 30 seconds onto a glass substrate, then the solvent was removed by heating at 100° C. for 1 minute and heating at 130° C. for 3 minutes, following which the applied varnish was cured with a low-pressure mercury vapor lamp under a cumulative exposure dose of 200 mJ/cm$^2$, thereby giving a cured film. Upon measurement, the resulting film was found to have a refractive index at 550 nm of 1.7641.

Example 7

Refractive Index Measurement 2

Aside from setting the amount of N-vinylformamide (Tokyo Chemical Industry) to 0.50 g and setting the amount of cyclohexanone/ion-exchanged water (96:4, wt/wt) used for adjusting the concentration to 2.18 g, a varnish having a total solids concentration of 15 wt % (adding the NVF to the solids content, the total solids concentration was 21 wt %) (referred to below as "HB-TmDA40VF4") was prepared in the same way as in Example 6.

Next, aside from using the resulting HB-TmDA40VF4 varnish, a cured film was produced in the same way as in Example 6. Upon measurement, the resulting film was found to have a refractive index at 550 nm of 1.7649.

Example 8

Refractive Index Measurement 3

Aside from setting the amount of N-vinylformamide (Tokyo Chemical Industry) to 0.75 g and setting the amount of cyclohexanone/ion-exchanged water (96:4, wt/wt) used for adjusting the concentration to 1.93 g, a varnish having a total solids concentration of 15 wt % (adding the NVF to the solids content, the total solids concentration was 25 wt %) (referred to below as "HB-TmDA40VF5") was prepared in the same way as in Example 6.

Next, aside from using the resulting HB-TmDA40VF5 varnish, a cured film was produced in the same way as in Example 6. Upon measurement, the resulting film was found to have a refractive index at 550 nm of 1.7463.

Example 9

Refractive Index Measurement 4

Aside from setting the amount of N-vinylformamide (Tokyo Chemical Industry) to 1.00 g and setting the amount of cyclohexanone/ion-exchanged water (96:4, wt/wt) used for adjusting the concentration to 1.68 g, a varnish having a total solids concentration of 15 wt % (adding the NVF to the solids content, the total solids concentration was 28 wt %) (referred to below as "HB-TmDA40VF6") was prepared in the same way as in Example 6.

Next, aside from using the resulting HB-TmDA40VF6 varnish, a cured film was produced in the same way as in Example 6. Upon measurement, the resulting film was found to have a refractive index at 550 nm of 1.7452.

Example 10

Refractive Index Measurement 5

Aside from setting the amount of N-vinylformamide (Tokyo Chemical Industry) to 1.50 g and setting the amount of cyclohexanone/ion-exchanged water (96:4, wt/wt) used for adjusting the concentration to 1.18 g, a varnish having a total solids concentration of 15 wt % (adding the NVF to the solids content, the total solids concentration was 34 wt %) (referred to below as "HB-TmDA40VF7") was prepared in the same way as in Example 6.

Next, aside from using the resulting HB-TmDA40VF7 varnish, a cured film was produced in the same way as in Example 6. Upon measurement, the resulting film was found to have a refractive index at 550 nm of 1.7441.

From the results in Examples 6 to 10, the film-forming compositions of the invention, in spite of the addition of a low-refractive index ingredient as the linear ingredient, did not show a large decline in the refractive index of the resulting thin films. It is thus apparent that adding a linear ingredient is an effective way to obtain good film-formability, increase film thickness and achieve a good resistance to cracking.

Production Example 5

A 25 wt % solution was prepared by dissolving 100 g of the HB-TmDA40 obtained in Synthesis Example 1 in 300.0 g of N-vinylformamide.

Example 11

Preparation of Solvent-Free Varnish

A varnish having a total solids content of 100 wt % (referred to below as "HB-TmDA40VF8") was prepared by adding together 3.0 g of the solution prepared in Synthesis Example 5, 0.3 g of pentaerythritol triallyl ether (Neoallyl P-30M, from Daiso), 0.075 g of a 5 wt % N-vinylformamide solution of BYK-307 (BYK-Chemie Japan KK), 0.0375 g of CXC-1802 (King Industries, Inc.) and 0.839 g of N-vinylformamide, and visually confirming that dissolution had occurred.

Example 12

Preparation of Solvent-Free Varnish

A varnish having a total solids content of 100 wt % (referred to below as "HB-TmDA40VF9") was prepared by adding together 3.0 g of the solution prepared in Synthesis Example 5, 0.375 g of pentaerythritol triallyl ether (Neoallyl P-30M, from Daiso), 0.075 g of a 5 wt % N-vinylformamide solution of BYK-307 (BYK-Chemie Japan KK), 0.0375 g of CXC-1802 (King Industries, Inc.) and 0.763 g of N-vinylformamide, and visually confirming that dissolution had occurred.

Example 13

Preparation of Solvent-Free Varnish

A varnish having a total solids content of 100 wt % (referred to below as "HB-TmDA40VF10") was prepared by adding together 3.0 g of the solution prepared in Synthesis Example 5, 0.45 g of pentaerythritol triallyl ether (Neoallyl P-30M, from Daiso), 0.075 g of a 5 wt % N-vinylformamide solution of BYK-307 (BYK-Chemie Japan KK), 0.0375 g of CXC-1802 (King Industries, Inc.) and 0.687 g of N-vinylformamide, and visually confirming that dissolution had occurred.

Example 14

Refractive Index Measurement 1

Using a spin coater, the HB-TmDA40VF8 varnish prepared in Example 11 was spin-coated onto a soda-lime glass substrate at 200 rpm for 5 seconds and at 2,000 rpm for 30 seconds, following which a 10-minute bake at 100° C. was carried out on a hot plate. Upon measurement, the resulting film was found to have a refractive index at 550 nm of 1.699.

Example 15

Refractive Index Measurement 2

Aside from using the HB-TmDA40VF9 varnish prepared in Example 12, a cured film was obtained in the same way as in Example 5. Upon measurement, the resulting film was found to have a refractive index at 550 nm of 1.702.

Example 16

Refractive Index Measurement 3

Aside from using the HB-TmDA40VF10 varnish prepared in Example 13, a cured film was obtained in the same way as in Example 5. Upon measurement, the resulting film was found to have a refractive index at 550 nm of 1.719.

The invention claimed is:

1. A film-forming composition comprising:
  (A) a triazine ring-containing polymer which comprises a recurring unit structure of formula (1) below:

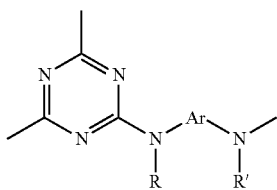

(1)

wherein R and R' are each independently a hydrogen atom, an alkyl group, an alkoxy group, an aryl group or an aralkyl group; and Ar is at least one moiety selected from the group consisting of moieties of formulas (2) to (13) below:

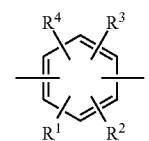

(2)

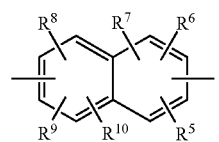

(3)

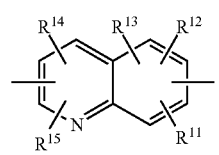

(4)

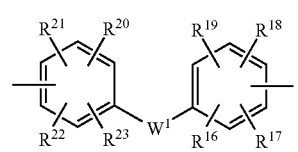

(5)

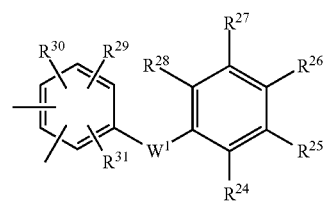

(6)

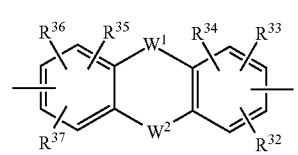

(7)

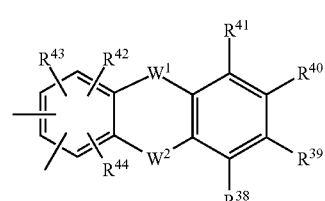

(8)

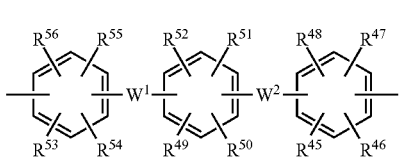

(9)

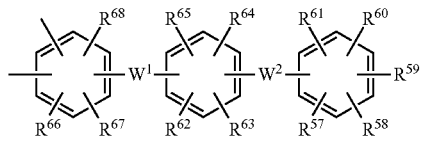

(10)

-continued

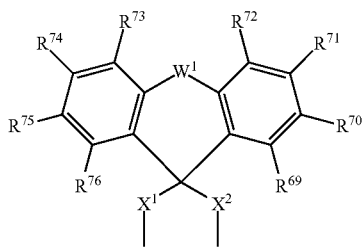
(11)

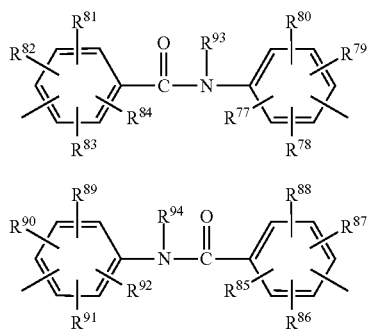
(12)

(13)

wherein $R^1$ to $R^{92}$ are each independently a hydrogen atom, a halogen atom, a carboxyl group, a sulfone group, an alkyl group of 1 to 10 carbons, or an alkoxy group of 1 to 10 carbons; $R^{93}$ and $R^{94}$ are hydrogen atoms or alkyl groups of 1 to 10 carbons; $W^1$ and $W^2$ are each independently a single bond, $CR^{95}R^{96}$ (wherein $R^{95}$ and $R^{96}$ are each independently a hydrogen atom or an alkyl group of 1 to 10 carbons, with the proviso that $R^{95}$ and $R^{96}$ may together form a ring), C=O, O, S, SO, $SO_2$ or $NR^{97}$ (wherein $R^{97}$ is a hydrogen atom or an alkyl group of 1 to 10 carbons); and $X^1$ and $X^2$ are each independently a single bond, an alkylene group of 1 to 10 carbons, or a group of formula (14) below:

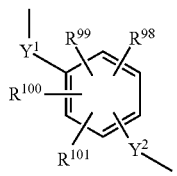
(14)

wherein $R^{98}$ to $R^{101}$ are each independently a hydrogen atom, a halogen atom, a carboxyl group, a sulfone group, an alkyl group of 1 to 10 carbons, or an alkoxy group of 1 to 10 carbons; and $Y^1$ and $Y^2$ being each independently a single bond or an alkylene group of 1 to 10 carbons;

(B) a crosslinking agent; and
1 to 200 parts by weight of (C) an organic monomer capable of providing a linear polymer, wherein the organic monomer is a compound of formula (A) below

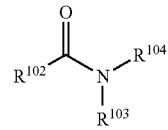
(A)

wherein $R^{102}$ and $R^{104}$ are each independently a hydrogen atom, an alkyl group of 1 to 10 carbons or a polymerizable carbon-carbon double bond-containing group; and $R^{103}$ being a hydrogen atom or an alkyl group of 1 to 10 carbons, with the proviso that either of $R^{102}$ and $R^{104}$ is a polymerizable carbon-carbon double bond-containing group but $R^{102}$ and $R^{104}$ are not both at the same time polymerizable carbon-carbon double bond-containing groups, per 100 parts by weight of said triazine-ring containing polymer (A),
wherein said film-forming composition is solvent-free.

2. The film-forming composition of claim 1, wherein $R^{102}$ and $R^{103}$ in formula (A) are both hydrogen atoms and $R^{104}$ is a polymerizable carbon-carbon double bond-containing group.

3. The film-forming composition of claim 1 or 2, wherein the organic monomer is N-vinylformamide.

4. The film-forming composition of claim 1, wherein the crosslinking agent is a polyfunctional epoxy compound and/or a polyfunctional (meth)acrylic compound.

5. The film-forming composition of claim 4, wherein the crosslinking agent is a polyfunctional (meth)acrylic compound.

6. The film-forming composition of claim 5, wherein the polyfunctional (meth)acrylic compound is a compound which at 25° C. is liquid and has a viscosity of 5,000 mPa·s or less.

7. The film-forming composition of claim 1, wherein the crosslinking agent is a polyfunctional epoxy compound, a polyfunctional vinyl ether compound or a polyfunctional allyl ether compound.

8. The film-forming composition of claim 7, wherein the crosslinking agent is a polyfunctional allyl ether compound.

9. An embedding material composed of the film-forming composition of claim 1.

10. An embedding film obtained from the embedding material of claim 9.

11. An electronic device comprising the embedding film of claim 10.

12. A cured film obtained by curing a solvent-free film-forming composition comprising:
(A) a triazine ring-containing polymer which comprises a recurring unit structure of formula (1) below:

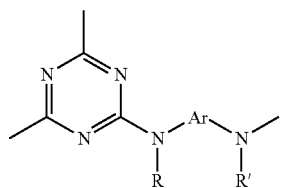
(1)

wherein R and R' are each independently a hydrogen atom, an alkyl group, an alkoxy group, an aryl group or an aralkyl group; and Ar is at least one moisety selected from the group consisting of moieties of formulas (2) to (13) below:

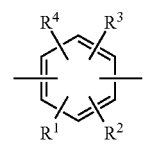
(2)

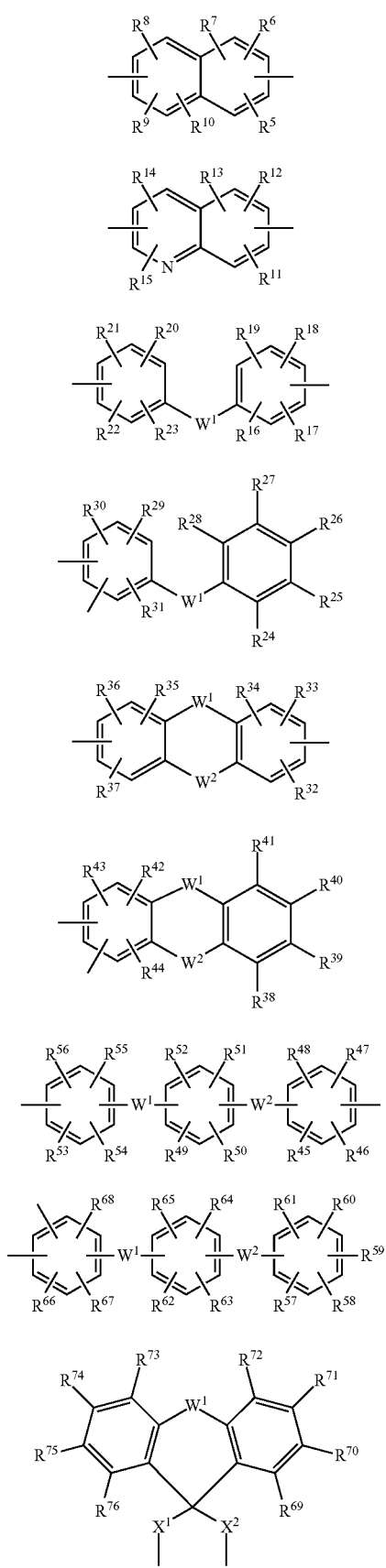

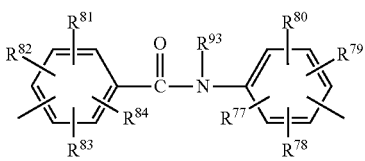

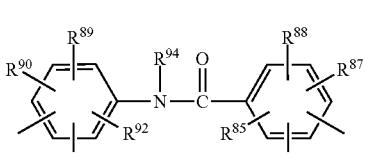

wherein $R^1$ to $R^{92}$ are each independently a hydrogen atom, a halogen atom, a carboxyl group, a sulfone group, an alkyl group 1 to 10 carbons, or an alkoxy group of 1 to 10 carbons; $R^{93}$ and $R^{94}$ R are hydrogen atoms or alkyl groups of 1 to 10 carbons; $W^1$ and $W^2$ are each independently a single bond, $CR^{95}R^{96}$ (wherein $R^{95}$ and $R^{96}$ are each independently a hydrogen atom or an alkyl group of 1 to 10 carbons, with the proviso that $R^{95}$ and $R^{96}$ may together form a ring), $C=O$, O, S, SO, $SO_2$ or $NR^{97}$ (wherein $R^{97}$ is a hydrogen atom or an alkyl group of 1 to 10 carbons); and $X^1$ and $X^2$ are each independently a single bond, an alkylene group of 1 to 10 carbons, or a group of formula (14) below:

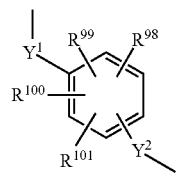

wherein $R^{98}$ to $R^{101}$ are each independently a hydrogen atom, a halogen atom, a carboxyl group, a sulfone group, an alkyl group of 1 to 10 carbons, or an alkoxy group of 1 to 10 carbons; and $Y^1$ and $Y^2$ being each independently a single bond or an alkylene group of 1 to 10 carbons;

(B) a crosslinking agent; and 1 to 200 parts by weight of (C) an organic monomer capable of providing a linear polymer, wherein the organic monomer is a compound of formula (A) below

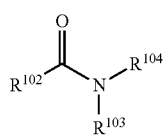

wherein $R^{102}$ and $R^{104}$ are each independently a hydrogen atom, an alkyl group of 1 to 10 carbons or a polymerizable carbon-carbon double bond-containing group; and $R^{103}$ being a hydrogen atom or an alkyl group of 1 to 10 carbons, with the proviso that either one of $R^{102}$ and $R^{104}$ is a polymerizable carbon-carbon double bond-containing group but $R^{102}$ and $R^{104}$ are not both at the same time polymerizable carbon-carbon double bond-containing groups, per 100 parts by weight of said triazine-ring containing polymer (A).

13. An electronic device comprising the cured film of claim 12.

14. A top emission-type organic electroluminescence device comprising a cured film obtained by curing a solvent-free film-forming composition comprising:

(A) a triazine ring-containing polymer which comprises a recurring unit structure of formula (1) below:

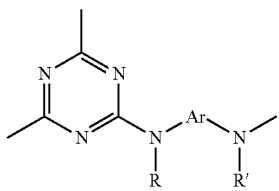
(1)

wherein R and R' are each independently a hydrogen atom, an alkyl group, an alkoxy group, an aryl group or an aralkyl group; and Ar is at least one moiety selected from the group consisting of moieties of formulas (2) to (13) below:

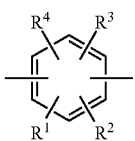
(2)

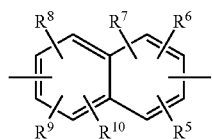
(3)

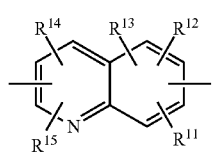
(4)

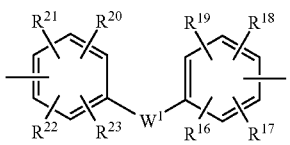
(5)

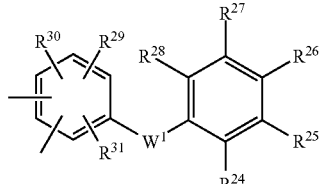
(6)

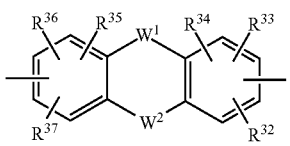
(7)

-continued

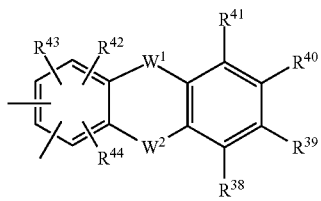
(8)

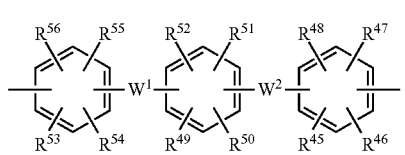
(9)

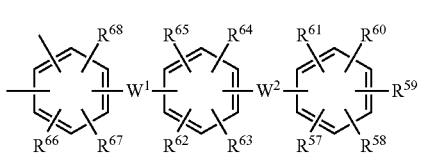
(10)

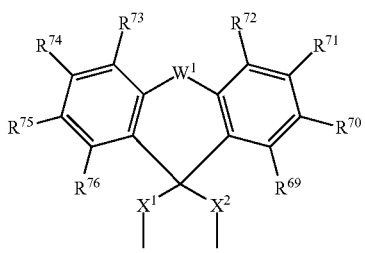
(11)

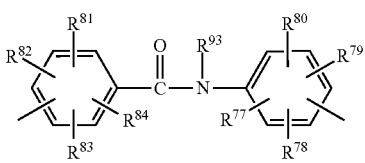
(12)

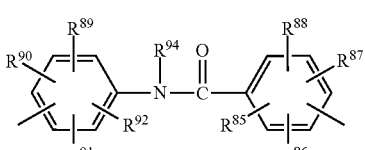
(13)

wherein $R^1$ to $R^{92}$ are each independently a hydrogen atom, a halogen atom, a carboxyl group, a sulfone group, an alkyl group of 1 to 10 carbons, or an alkoxy group of 1 to 10 carbons; $R^{93}$ and $R^{94}$ are hydrogen atoms or alkyl groups of 1 to 10 carbons; $W^1$ and $W^2$ are each independently a single bond, $CR^{95}R^{96}$ (wherein $R^{95}$ and $R^{96}$ are each independently a hydrogen atom or an alkyl group of 1 to 10 carbons, with the proviso that $R^{95}$ and $R^{96}$ may together form a ring), C=O, O, S, SO, $SO_2$ or $NR^{97}$ (wherein $R^{97}$ is a hydrogen atom or an alkyl group of 1 to 10 carbons); and $X^1$ and $X^2$ are each independently a single bond, an alkylene group of 1 to 10 carbons, or a group of formula (14) below:

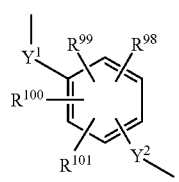

(14)

wherein $R^{98}$ to $R^{101}$ are each independently a hydrogen atom, a halogen atom, a carboxyl group, a sulfone group, an alkyl group of 1 to 10 carbons, or an alkoxy group of 1 to 10 carbons; and $Y^1$ and $Y^2$ being each independently a single bond or an alkylene group of 1 to 10 carbons;

(B) a crosslinking agent; and 1 to 200 parts by weight of (C) an organic monomer capable of providing a linear polymer, wherein the organic monomer is a compound of formula (A) below

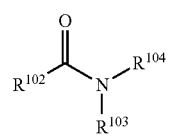

(A)

wherein $R^{102}$ and $R^{104}$ are each independently a hydrogen atom, an alkyl group of 1 to 10 carbons or a polymerizable carbon-carbon double bond-containing group; and $R^{103}$ being a hydrogen atom or an alkyl group of 1 to 10 carbons, with the proviso that either one of $R^{102}$ and $R^{104}$ is a polymerizable carbon-carbon double bond-containing group but $R^{102}$ and $R^{104}$ are not both at the same time polymerizable carbon-carbon double bond-containing groups, per 100 parts by weight of said triazine-ring containing polymer (A).

* * * * *